United States Patent
Wakiyama

(10) Patent No.: US 12,446,348 B2
(45) Date of Patent: Oct. 14, 2025

(54) SOLID-STATE IMAGING ELEMENT, MANUFACTURING METHOD, AND ELECTRONIC DEVICE

(71) Applicant: SONY SEMICONDUCTOR SOLUTIONS CORPORATION, Kanagawa (JP)

(72) Inventor: Satoru Wakiyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 61 days.

(21) Appl. No.: 16/347,432

(22) PCT Filed: Nov. 1, 2017

(86) PCT No.: PCT/JP2017/039471
§ 371 (c)(1),
(2) Date: May 3, 2019

(87) PCT Pub. No.: WO2018/088284
PCT Pub. Date: May 17, 2018

(65) Prior Publication Data
US 2019/0333954 A1    Oct. 31, 2019

(30) Foreign Application Priority Data

Nov. 14, 2016    (JP) ................................. 2016-221187

(51) Int. Cl.
*H10F 39/00*    (2025.01)
*A61B 1/04*    (2006.01)

(52) U.S. Cl.
CPC ............. *H10F 39/809* (2025.01); *A61B 1/04* (2013.01); *H10F 39/016* (2025.01);
(Continued)

(58) Field of Classification Search
CPC .. H10F 39/809; H10F 39/026; H10F 39/8063; H10F 39/016; H10F 39/802; H10F 39/024
See application file for complete search history.

(56) References Cited

U.S. PATENT DOCUMENTS 5,264,395 A * 11/1993 Bindal .................. H01L 21/304
257/E21.23
2002/0004257 A1* 1/2002 Takaoka ............. H01L 23/5384
257/E23.174
(Continued)

FOREIGN PATENT DOCUMENTS

CN    101840925 A    9/2010
CN    102110700 A    6/2011
(Continued)

OTHER PUBLICATIONS

Merriam-Webster Definition of Diamateric. No Date.*
(Continued)

*Primary Examiner* — Nathan W Ha
(74) *Attorney, Agent, or Firm* — Sheridan Ross PC

(57) ABSTRACT

The present disclosure relates to a solid-state image sensor, a manufacturing method, and an electronic device that enable control of a wafer process and a chip size package (CSP) process even with no cover glass. A CIS wafer and a logic wafer including a logic circuit or a memory circuit are stacked and bonded. The CIS wafer and the logic wafer are electrically connected via a through electrode. After formation of a lens on a light receiving surface of the CIS wafer, a wafer support system material is bonded on the lens. An external electrode is formed as an external output, using a TSV formed from a back surface side of the logic wafer that has been made into a thin film. The wafer support system material is then separated from the light receiving surface.

(Continued)

The present disclosure can be applied to, for example, a stacked-type back-illuminated solid-state image sensor.

20 Claims, 25 Drawing Sheets

(52) U.S. Cl.
CPC ......... *H10F 39/024* (2025.01); *H10F 39/026* (2025.01); *H10F 39/802* (2025.01); *H10F 39/8063* (2025.01)

(56) References Cited

U.S. PATENT DOCUMENTS

| | | | | |
|---|---|---|---|---|
| 2002/0030288 A1* | 3/2002 | Hashimoto | ............ | H01L 24/05 257/784 |
| 2005/0170555 A1* | 8/2005 | Hirano | ............ | H01L 21/76838 257/E21.582 |
| 2008/0272465 A1* | 11/2008 | Do | ............ | H01L 24/82 257/620 |
| 2012/0104529 A1* | 5/2012 | Tanaka | ............ | C09B 67/0033 430/7 |
| 2013/0075587 A1* | 3/2013 | Suzuki | ............ | H01L 24/32 250/208.1 |
| 2014/0252640 A1* | 9/2014 | Kwak | ............ | H01L 23/5381 257/773 |
| 2014/0273350 A1* | 9/2014 | Kwak | ............ | H01L 25/0657 438/109 |
| 2014/0291854 A1* | 10/2014 | Lee | ............ | H01L 25/0657 257/774 |
| 2015/0031215 A1* | 1/2015 | Mahoney | ............ | H01L 21/6836 438/759 |
| 2015/0115411 A1* | 4/2015 | Ozaki | ............ | H01L 29/7786 257/620 |
| 2016/0163754 A1* | 6/2016 | Igarashi | ............ | H01L 27/14629 257/432 |
| 2016/0284753 A1* | 9/2016 | Komai | ............ | H01L 27/1469 |
| 2017/0230599 A1* | 8/2017 | Abiru | ............ | H03M 1/66 |

FOREIGN PATENT DOCUMENTS

| | | | | |
|---|---|---|---|---|
| CN | 104051487 A | | 9/2014 | |
| CN | 104393065 A | * | 3/2015 | |
| CN | 105593995 A | | 5/2016 | |
| JP | H08-130227 | | 5/1996 | |
| JP | 2003-101001 | | 4/2003 | |
| JP | 2007-173586 | | 5/2007 | |
| JP | 2011-057964 | | 3/2011 | |
| JP | 2011-193007 | | 9/2011 | |
| JP | 2012084693 A | | 4/2012 | |
| JP | 2013-084880 | | 5/2013 | |
| JP | 2014-220370 | | 11/2014 | |
| JP | 2015-088666 | | 5/2015 | |
| JP | 2015-135938 | | 7/2015 | |
| JP | 2016-171297 | | 9/2016 | |
| KR | 20010090556 A | * | 10/2001 | ............ H01L 24/19 |
| KR | 20150120497 A | | 10/2015 | |
| WO | WO-9620497 A1 | * | 7/1996 | ......... H01L 21/6835 |
| WO | WO-2016027683 A1 | * | 2/2016 | ............ H03M 1/56 |
| WO | WO-2016056409 A1 | | 4/2016 | |

OTHER PUBLICATIONS

Merriam-Webster Definition of Mil. No Date.*
CN-104393065-A—in English.*
KR-20010090556-A—in Korean.*
Merriam Webster Online definition of "bonded." No Date!*
Euclid, Elements of Geometry, Book I, Common Notions, Edited by Sir Thomas Heath, 1908.*
International Search Report prepared by the Japan Patent Office on Dec. 27, 2017, for International Application No. PCT/JP2017/039471.

* cited by examiner

SOLID-STATE IMAGING ELEMENT, MANUFACTURING METHOD, AND ELECTRONIC DEVICE

CROSS REFERENCE TO RELATED APPLICATIONS

This application is a national stage application under 35 U.S.C. 371 and claims the benefit of PCT Application No. PCT/JP2017/039471 having an international filing date of 1 Nov. 2017, which designated the United States, which PCT application claimed the benefit of Japanese Patent Application No. 2016-221187 filed 14 Nov. 2016, the entire disclosures of each of which are incorporated herein by reference.

TECHNICAL FIELD

The present disclosure relates to a solid-state image sensor, a manufacturing method, and an electronic device, and particularly relates to a solid-state image sensor, a manufacturing method, and an electronic device that enable control of a wafer process and a chip size package (CSP) process, and a decrease in device height, even with no cover glass.

BACKGROUND ART

Since a back-illuminated solid-state image sensor is formed on a side opposite to a wiring layer surface, sensor chip thinning and a supporting substrate are indispensable, and a stacked-type back-illuminated imaging element in which a supporting substrate is replaced with a logic chip and the logic chip is electrically connected to a sensor chip has been proposed. For example, Patent Document 1 proposes a back-illuminated image sensor in which a surface of an image element having a pixel circuit and an individual surface of a semiconductor element having a logic circuit are electrically connected.

In addition, Patent Document 2 proposes a solid-state image sensor in which, in wafer level chip size package (WLCSP) adopting a structure in which an imaging element and a cover glass are bonded with a transparent adhesive, the cover glass is bonded with a transparent resin and a CSP process is controlled, so that an electrode is formed on a back surface of a semiconductor element.

CITATION LIST

Patent Document

Patent Document 1: Japanese Patent Application Laid-Open No. 2014-220370
Patent Document 2: Japanese Patent Application Laid-Open No. 2007-173586

SUMMARY OF THE INVENTION

Problems to be Solved by the Invention

However, in the case of the proposal in Patent Document 1, both the back-illuminated solid-state image sensor and the semiconductor element stacked on the back surface side are thin in thickness, which is 1 um or less, and have no support substrate and have weak strength. Therefore, there is a high possibility of occurrence of stress concentration. As a result, the white spot/dark current may increase. Furthermore, since the back-illuminated solid-state image sensor is weak in strength, control of a wafer process and, for example, a CSP process or the like, has been difficult, and a decrease in device height has been difficult.

In the case of the proposal in Patent Document 2, an external electrode is formed on the back surface of the semiconductor element, using a through-silicon via (TSV), and thus the semiconductor element needs to be thinned, and cover glass is bonded to hold rigidity of a completed chip size package (CSP). Therefore, device thinning is difficult. Furthermore, imaging characteristics due to flare by the cover glass has been deteriorated.

The present disclosure has been made in view of such circumstances, and the present disclosure enables control of a wafer process and a DSP process, and a decrease in device height, even with no cover glass.

Solutions to Problems

A solid-state image sensor according to one aspect of the present technology includes a first semiconductor element including a pixel including a photoelectric conversion element, a second semiconductor element including a logic circuit or a memory circuit and stacked with and bonded to the first semiconductor element, a through electrode electrically connecting the first semiconductor element and the second semiconductor element, an external electrode formed as an external output, using a through-silicon via (TSV) formed from a back surface side of the thinned second semiconductor element, and a wafer support system material bonded on a lens after formation of the lens on a light receiving surface of the first semiconductor element, and separated from the light receiving surface after formation of the external electrode.

The external electrode is a planarized Cu electrode.

The external electrode is an NiAu electrode.

The TSV formed from the back surface side of the second semiconductor element goes through a low-K and is connected with an Al pad of the first semiconductor element.

The TSV is formed after the first semiconductor element and the second semiconductor element are bonded together.

The TSV is formed before the first semiconductor element and the second semiconductor element are bonded together.

An optical function film is firmed on the lens of the first semiconductor element.

The optical function film is an IR cut filter and AR coating, or a wafer level lens.

The optical function film is formed after the wafer support system material is separated from the light receiving surface of the first semiconductor element.

A thickness of the wafer support system material is equal to or larger than 300 um.

The wafer support system material contains a glass substrate or an Si substrate.

In a manufacturing method according to one aspect of the present technology, a manufacturing apparatus stacks and bonds a first semiconductor element including a pixel including a photoelectric conversion element and a second semiconductor element including a logic circuit or a memory circuit, electrically connects the first semiconductor element and the second semiconductor element via a through electrode, bonds a wafer support system material on a lens after formation of the lens on a light receiving surface of the first semiconductor element, forms an external electrode for an external output, using a through-silicon via (TSV) formed from a back surface side of the thinned second semiconductor element, and separates the wafer support system material from the light receiving surface after formation of the external electrode.

An electronic device according to one aspect of the present technology includes a solid-state image sensor including a first semiconductor element including a pixel including a photoelectric conversion element, a second semiconductor element including a logic circuit or a memory circuit and stacked with and bonded to the first semiconductor element, a through electrode electrically connecting the first semiconductor element and the second semiconductor element, an external electrode formed as an external output, using a through-silicon via (TSV) formed from a back surface side of the thinned second semiconductor element, a wafer support system material bonded on a lens after formation of the lens on a light receiving surface of the first semiconductor element, and separated from the light receiving surface after formation of the external electrode, a signal processing circuit configured to process an output signal output from the solid-state image sensor, and an optical system configured to cause incident light to enter the solid-state image sensor.

In one aspect of the present technology, a first semiconductor element including a pixel including a photoelectric conversion element and a second semiconductor element including a logic circuit or a memory circuit are stacked and bonded, the first semiconductor element and the second semiconductor element are electrically connected via a through electrode, and a wafer support system material is bonded on a lens after formation of the lens on a light receiving surface of the first semiconductor element. Then, an external electrode for an external output is formed using a through-silicon via (TSV) formed from a back surface side of the thinned second semiconductor element, and the wafer support system material is separated from the light receiving surface after formation of the external electrode.

Effects of the Invention

According to the present technology, control of a wafer process and a chip size package (CSP) process can be performed even with no cover glass.

Note that effects described in the present specification are merely examples, and effects of the present technology are not limited to the effects described in the specification, and there may be additional effects.

MODE FOR CARRYING OUT THE INVENTION

Hereinafter, a mode for implementing the present disclosure (hereinafter referred to as embodiment) will be described. Note that the description will be given in the following order.

0. Device Description
1. Embodiment
2. Use Examples of Image Sensor
3. Example of Electronic Device
4. Application Examples to Endoscope Surgery System
5. Application Examples to Moving Body 0. Device Description Schematic Configuration Example of Solid-State Image Sensor FIG. 1 illustrates a schematic configuration example of an example of a complementary metal oxide semiconductor (CMOS) solid-state image sensor applied to embodiments of the present technology.

Figure 1:
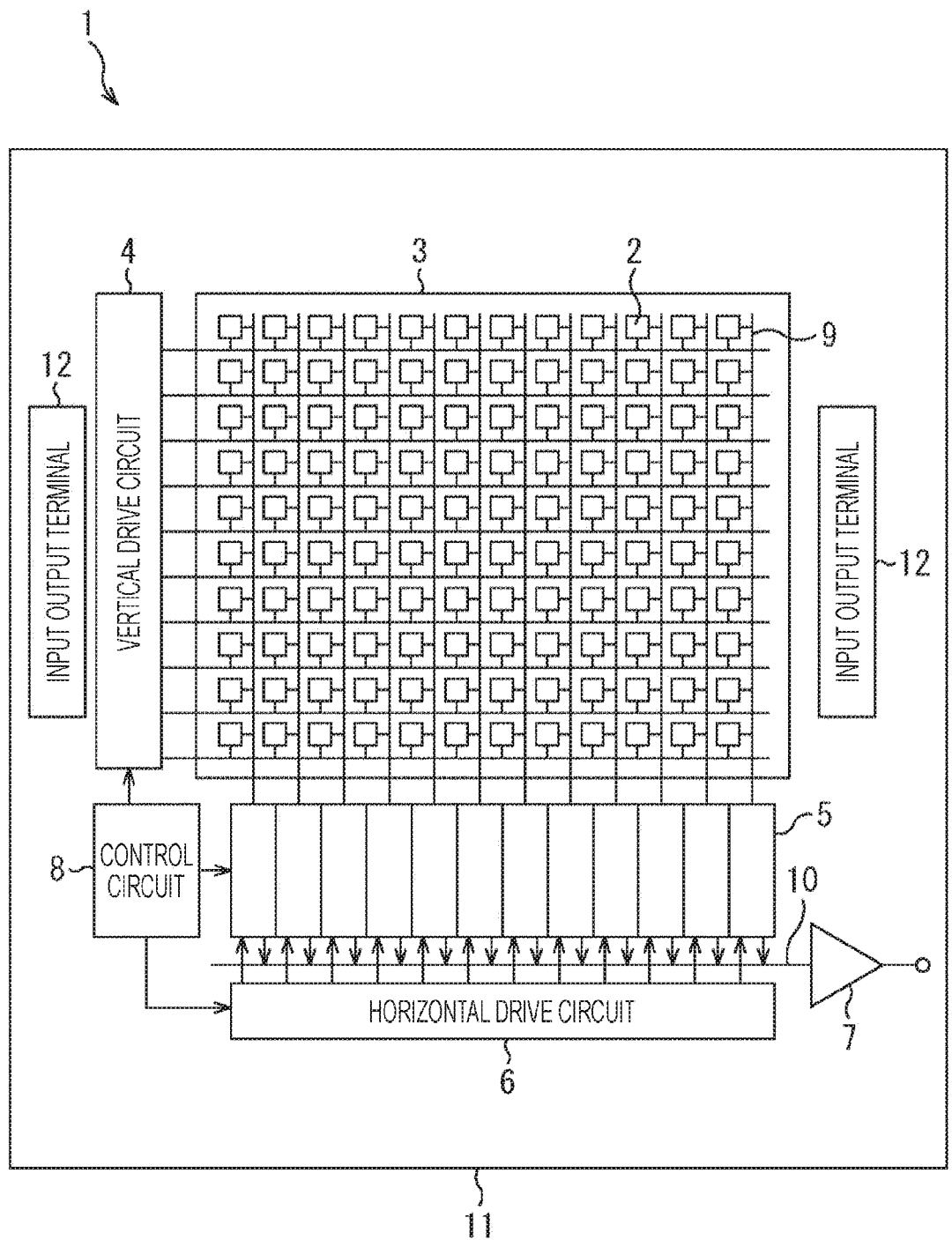
FIG. 1 is a block diagram illustrating a schematic configuration example of a solid-state image sensor to which the present technology is applied.

As illustrated in FIG. 1, a solid-state image sensor (element chip) 1 includes, on a semiconductor substrate 11 (for example, a silicon substrate), a pixel region (so-called imaging region) 3 in which pixels 2 including a plurality of photoelectric conversion elements are regularly arrayed in a two-dimensional manner, and a peripheral circuit region.

The pixel 2 includes a photoelectric conversion element (for example, a photodiode (PD)) and a plurality of pixel transistors (so-called MOS transistors). The plurality of pixel transistors can be configured by three transistors of a transfer transistor, a reset transistor, and an amplification transistor, for example, or can also be configured by four transistors to which a selection transistor is further added.

Furthermore, the pixel 2 may have a pixel sharing structure. The pixel sharing structure is configured by a plurality of photodiodes, a plurality of transfer transistors, one shared floating diffusion, and one each of other shared pixel transistors. The photodiode is a photoelectric conversion element.

The peripheral circuit region is configured by a vertical drive circuit 4, a column signal processing circuit 5, a horizontal drive circuit 6, an output circuit 7, and a control circuit 8.

The control circuit 8 receives an input clock and data that gives an instruction on an operation mode and the like, and outputs data of internal information and the like of the solid-state image sensor 1. Specifically, the control circuit 8 generates clock signals and control signals serving as references of operations of the vertical drive circuit 4, the column signal processing circuit 5, and the horizontal drive circuit 6 on the basis of a vertical synchronization signal, a horizontal synchronization signal, and a master clock. Then, the control circuit 8 inputs the signals to the vertical drive circuit 4, the column signal processing circuit 5, and the horizontal drive circuit 6.

The vertical drive circuit 4 is configured by a shift resistor, for example, and selects pixel drive wiring, supplies a pulse for driving the pixels 2 to the selected pixel drive wiring, and drives the pixels 2 on a row basis. Specifically, the vertical drive circuit 4 sequentially selectively scans the pixels 2 of the pixel region 3 in a vertical direction on a row basis, and supplies a pixel signal based on a signal charge generated according to the amount of received light in the photoelectric conversion element of each pixel 2 to the column signal processing circuit 5 via a vertical signal line 9.

The column signal processing circuit 5 is arranged in each column of the pixels 2, for example, and performs, for each pixel column, signal processing such as noise removal for signals output from the pixels 2 of one row. Specifically, the column signal processing circuit 5 performs signal processing such as correlated double sampling (CDS) for removing a fixed pattern noise unique to the pixels 2, signal amplification, and analog/digital (A/D) conversion. A horizontal selection switch (not illustrated) is connected and provided between an output stage of the column signal processing circuit 5 and a horizontal signal line 10.

The horizontal drive circuit 6 is configured by a shift resistor, for example, and sequentially outputs horizontal scanning pulses to select the column signal processing circuits 5 in turn, and causes the column signal processing circuits 5 to output the pixel signals to a horizontal signal line 10.

The output circuit 7 performs signal processing for the signals sequentially supplied from the column signal processing circuits 5 through the horizontal signal line 10, and outputs the signals. The output circuit 7 performs only buffering in some cases or performs various types of digital signal processing such as black level adjustment and column variation correction in some cases, for example.

An input output terminal 12 is provided for exchanging signals with the outside.

1. Embodiment

Structure Example of Solid-State Image Sensor

Figure 2:
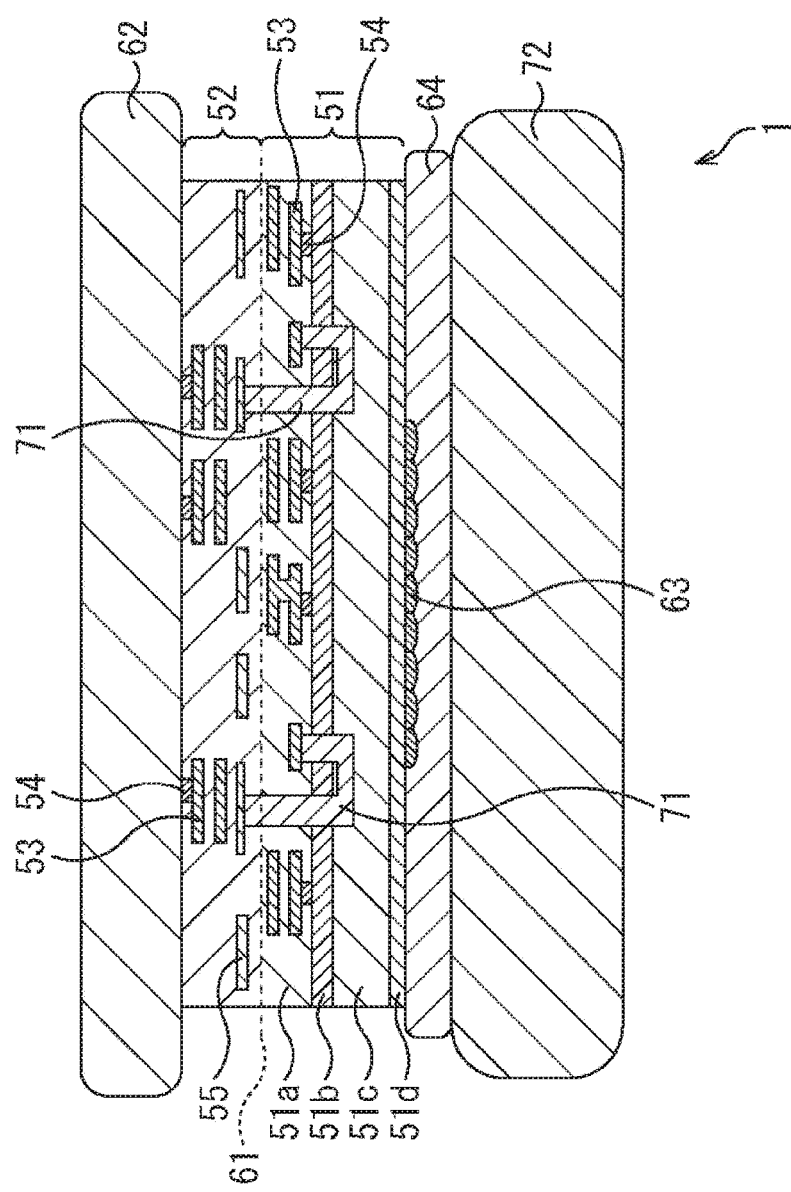
FIG. 2 is a cross-sectional view illustrating a structure example of the solid-state image sensor to which the present technology is applied.

FIG. 2 is a cross-sectional view illustrating a structure example of the solid-state image sensor to which the present technology is applied.

In the example of FIG. 2, the solid-state image sensor 1 is a stacked-type back-illuminated solid-state image sensor. The solid-state image sensor 1 has a CMOS image sensor (CIS) wafer 51 as a first semiconductor element and a logic wafer 52 as a second semiconductor element bonded together at a bonding surface 61.

The CIS wafer 51 is a semiconductor element including a photoelectric converter. The logic wafer 52 includes a logic circuit or a memory circuit. The CIS wafer 51 includes an oxide film 51a, a silicon layer 51b, an oxide film 51c, and a color filter 51d. The logic wafer 52 is constituted by an oxide film. Electrodes 54 are provided on a back surface side of some wirings 53 of the CIS wafer 51 and on a surface side of some wirings 53 of the logic wafer 52. An on chip lens (OCL) 63 is formed on the color filter 51d on the back surface side of the CIS wafer 51.

In other words, the CIS wafer 51 and the logic wafer 52 are bonded together by oxide film connection at the bonding surface 61. Furthermore, conduction between the CIS wafer 51 and the logic wafer 52 is secured using a through electrode 71 connected to the wiring 53 of the CIS wafer 51 and a PAD 55 of the logic wafer 52.

Then, in a process of manufacturing the solid-state image sensor 1, a wafer support system material 72 is connected on the OCL 63 formed on a back surface of the CIS wafer 51 via an adhesive 64.

Moreover, as will be described in detail below, an Si substrate 62 of the logic wafer 52 is thickened to 300 um or more, a high aspect through-silicon via (TSV) is produced, and the above-described wafer support system material 72 is separated after solder balls are soldered.

As described above, according to the present technology, control of a wafer process and a CSP process becomes possible and a decrease in device height becomes also possible, even with no cover glass where creation of a chip size package (CSP) structure using a TSV has been difficult.

Example of Manufacturing Processing

Figure 3:
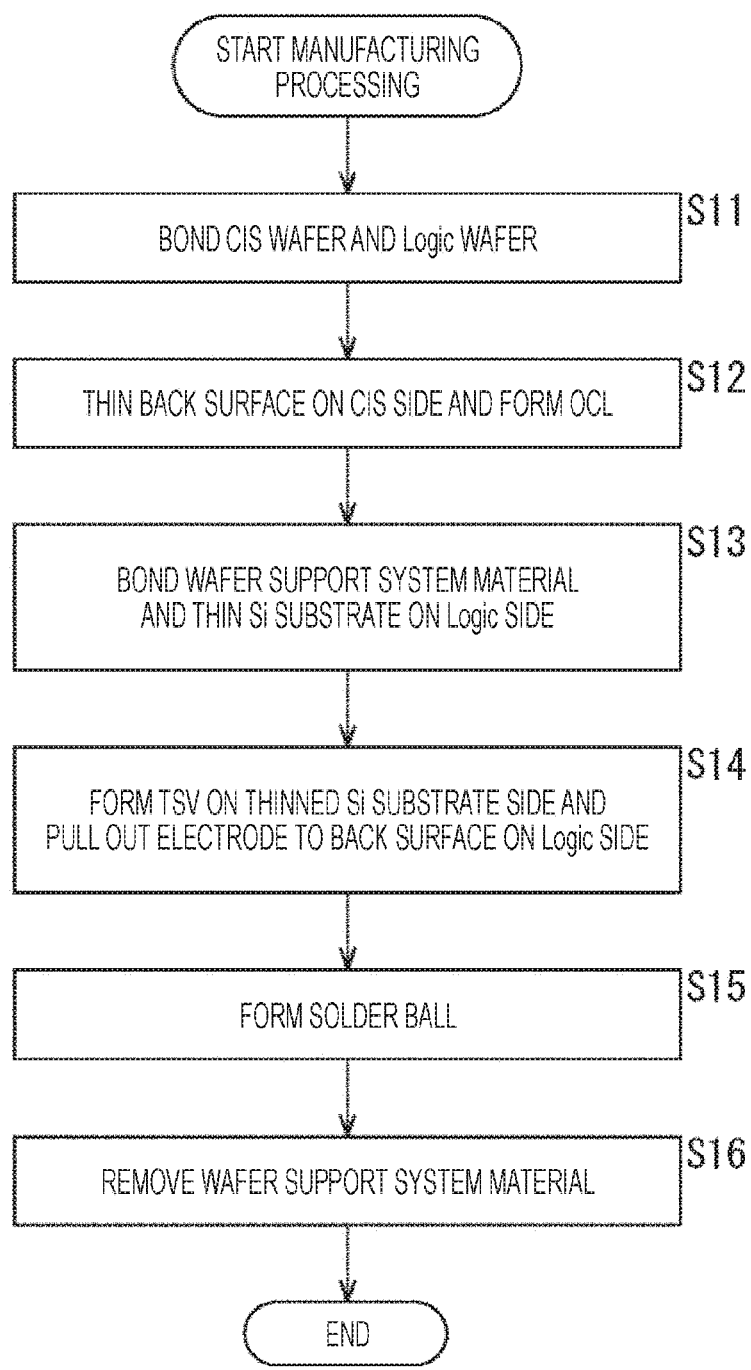
FIG. 3 is a flowchart for describing processing of manufacturing a solid-state image sensor.
Figure 4:
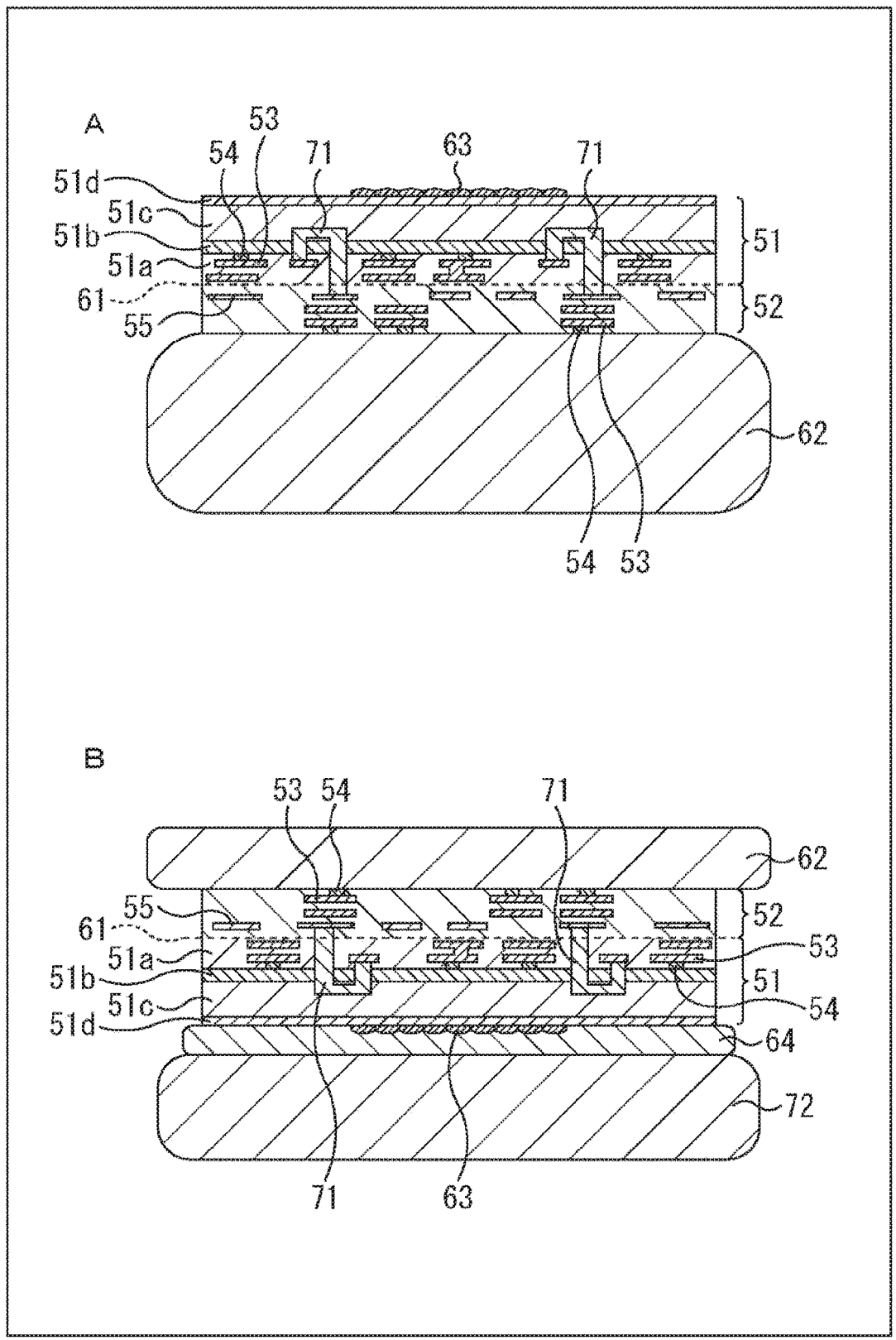
FIG. 4 is a process chart of the processing of manufacturing a solid-state image sensor.
Figure 5:
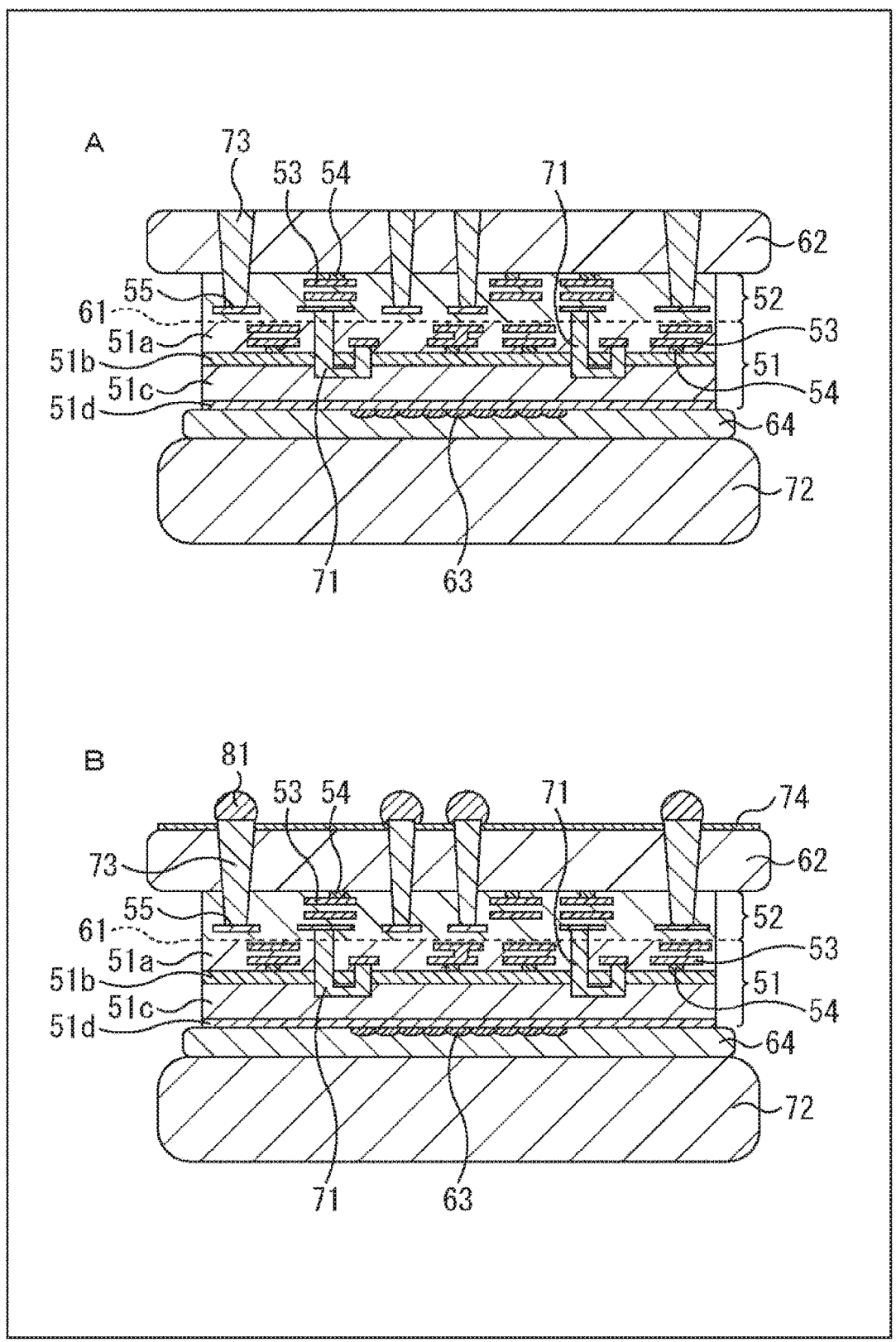
FIG. 5 is a process chart of the processing of manufacturing a solid-state image sensor.

Next, processing of manufacturing the back-illuminated solid-state image sensor in FIG. 2 (in other words, the CPS process) will be described with reference to the flowchart in FIG. 3. Note that this manufacturing processing is performed by a manufacturing apparatus, and the process charts in FIGS. 4 and 5 are appropriately referred to in the description.

In step S11, the manufacturing apparatus bonds the CIS wafer 51 and the logic wafer 52. At that time, the manufacturing apparatus secures conduction, using the through electrode 71 connected to the wiring 53 of the CIS wafer 51 and the PAD 55 of the logic wafer 52.

In step S12, the manufacturing apparatus thins the back surface on a CIS wafer 51 side (hereinafter also referred to as CIS side) and forms the OCL 63 on the back surface on the CIS side after bonding (A in FIG. 4).

In step S13, the manufacturing apparatus bonds the wafer support system material 72 on an CCL 63 surface on the CIS side with the adhesive 64, polishes the Si substrate 62 on a logic wafer 52 side (hereinafter also referred to as logic side) to thin the Si substrate 62 (B in FIG. 4).

The wafer support system material 72 is desirably a glass substrate or Si substrate having the same linear expansion coefficient as the CIS wafer 51 and the logic wafer 52 (hereinafter respectively referred to as devices) bonded together, and examples of the adhesive 64 for bonding the CIS wafer 51 and the logic wafer 52 include a silicone resin, an acrylic resin, an epoxy resin, dendrimer, polyimide, and copolymers of the aforementioned polymers. Furthermore, the heat resistance of the adhesive 64 is desirably set to 200° C. or higher in consideration of a thermal history in a formation process of a TSV 73 and a solder ball 81 to be described below. Furthermore, the wafer support system material 72 and the devices may be cured by heat or UV irradiation after bonded.

In step S14, the manufacturing apparatus produces, in the thinned Si substrate 62, the TSV 73 to be connected to the PAD 55 to be formed in the logic wafer 52, and pulls out an electrode to the back surface on the logic side (A in FIG. 5). Note that, at that time, planarization processing for an insulating film 74 is also performed. The method of planarizing the insulating film 74 may be any method such as CMP or mechanical polishing with a cutting tool.

In step S15, the manufacturing apparatus forms the solder ball 81 on the electrode pulled out to the back surface on the logic side (B in FIG. 5).

Figure 6:
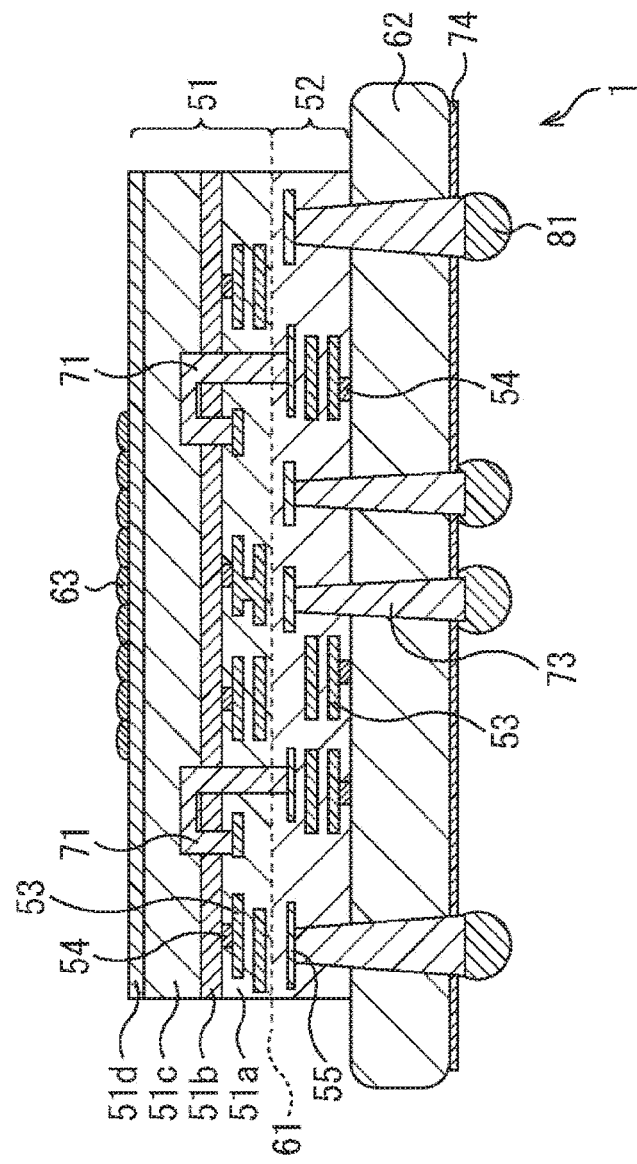
FIG. 6 is a cross-sectional view illustrating a structure example of the solid-state image sensor manufactured by the manufacturing processing in FIG. 3.

In step S16, the manufacturing apparatus removes the wafer support system material 72 from the OCL 63 surface on the CIS side, and completes the solid-state image sensor 1 as illustrated in FIG. 6.

In other words, the wafer support system material 72 is separated after control. The separation is performed by heating, shearing force, resin layer sublimation by laser, or the like. After the separation, cleaning is performed, in particular, so as not to leave a residue on the surface of the OCL 63 of the CIS wafer 51. The cleaning is favorably performed using chemicals such as thinner or tetramethylammonium hydroxide (TMAH) that dissolves the resin layer and does not damage the OCL 63.

In thinning the logic wafer 52, keeping the thickness of 300 um or more is desirable in consideration of the rigidity after removal of the wafer support system material 72.

As described above, in the solid-state image sensor 1 in FIG. 6, the wafer support system material 72 is used as a support substrate, whereby thinning of the back-illuminated solid-state image sensor becomes easy and formation of the TSV in pulling out an electrode to the back surface of the CIS/logic devices becomes easy. Furthermore, the wafer support system material is removed after the electrode is formed on the back surface side of CIS/logic, whereby thinning of the completed CSP becomes easy.

Furthermore, the wafer support system material that exhibits a similar linear expansion behavior with respect to the temperature to Si as much as possible is used, whereby the amount of device warping during control of the CPS process (process of manufacturing the solid-state image sensor) can be reduced.

Moreover, as the adhesive used to bond the support material and the devices (the CIS wafer 51 and the logic wafer 52), a silicone resin, dendrimer, polyimide, or a copolymer of the aforementioned polymers is used, for example, whereby deformation, degas, and the like are less likely to occur in the thermal history during the formation process of the TSV and the solder ball in the CPS process, and the process control can be easily performed.

The separation of the support substrate after control is performed by heating, shearing force, resin layer sublimation by laser, or the like, whereby the separation can be performed without damaging the OCL and the device itself.

The thickness of the thinned wafer on the logic side is set to 300 um, whereby the rigidity after removal of the wafer support system material can be maintained.

Another Structure Example of Solid-State Image Sensor

Note that, in the solid-state image sensor 1 in FIG. 6, an example in which the solder ball 81 is formed on the electrode pulled out using the TSV 73 to the back surface on the logic wafer 52 has been described.

Figure 7:
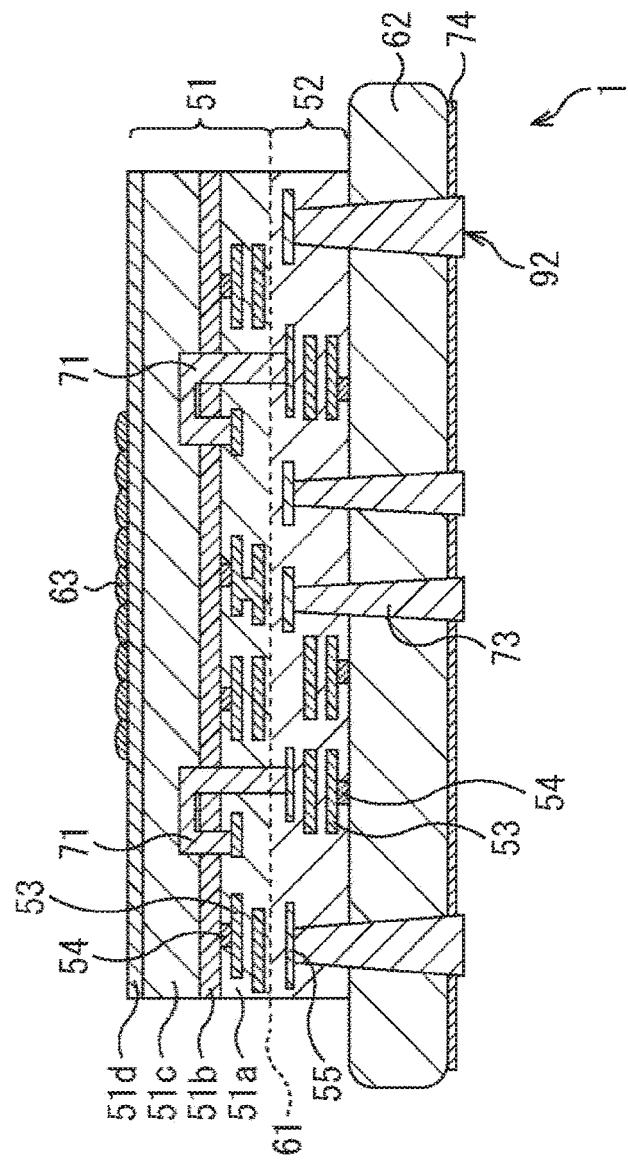
FIG. 7 is a cross-sectional view illustrating another structure example of the solid-state image sensor to which the present technology is applied.

In contrast, the solid-state image sensor 1 in FIG. 7 is common to the solid-state image sensor 1 in FIG. 6 up to pulling out the electrode using the TSV 73 to the back surface on the logic wafer 52 side and performing the planarization processing for the insulating film 74. Meanwhile, the solid-state image sensor 1 in FIG. 7 can have a structure in which the electrode is pulled out using the TSV 73 to the back surface on the logic wafer 52 side, the planarization processing for the insulating film 74 is performed, and then a Cu surface 92 of the electrode is exposed, unlike the solid-state image sensor 1 in FIG. 6.

As described above, in the solid-state image sensor in FIG. 7, the electrode is pulled out using the TSV to the back surface of the CIS/logic devices, the planarization processing for the insulating film is performed after planarization processing for the insulating film 74 is performed, and the Cu surface of the electrode is exposed, whereby the completed CPS can be further thinned.

Figure 8:
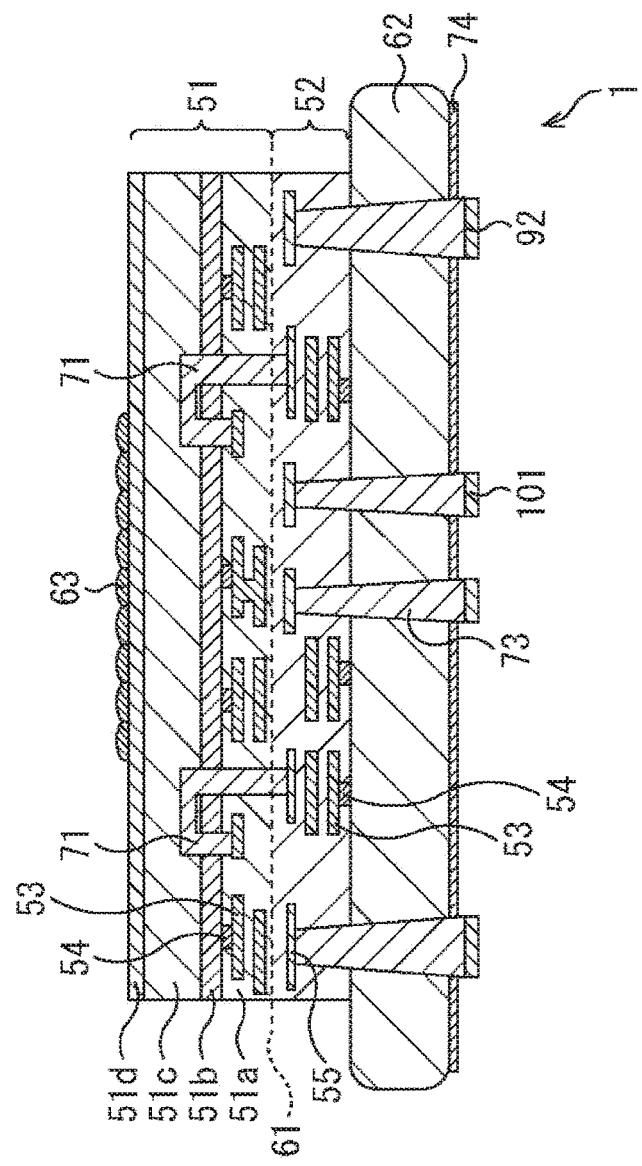
FIG. 8 is a cross-sectional view illustrating another structure example of the solid-state image sensor to which the present technology is applied.

Furthermore, the solid-state image sensor 1 in FIG. 8 is common to the solid-state image sensor 1 in FIG. 7 up to pulling out the electrode using the TSV 73 to the back surface on the logic wafer 52 side, then performing the planarization processing for the insulating film 74, and exposing the Cu surface 92 of the electrode. Meanwhile, the solid-state image sensor 1 in FIG. 8 can have a structure in which an Ni/Au electrode 101 is formed after the Cu surface 92 of the electrode is exposed, unlike the solid-state image sensor 1 in FIG. 7.

Note that the formation of the Ni/Au electrode 101 may be either by an electrolytic plating method or by an electroless plating method. Furthermore, the Ni/Au electrode 101 is formed on the Cu surface 92 before formation of the insulating film. 74, and then Ni/Au electrode 101 may be exposed at the same time with the planarization of the insulating film 74.

As described above, in the solid-state image sensor 1 in FIG. 8, the electrode is pulled out using the TSV to the back surface of the CIS/logic devices, then the planarization processing for the insulating film is performed, the Cu surface of the electrode is exposed, and then the Ni/Au electrode is formed, whereby the connectivity at the implementation to the wiring substrate can be improved at the same time with the planarization.

Moreover, in the solid-state image sensor 1 in FIG. 6, an example in which the TSV 73 is produced in the thinned Si substrate 62, and the electrode is pulled out to the back surface on the logic side has been described.

Figure 9:
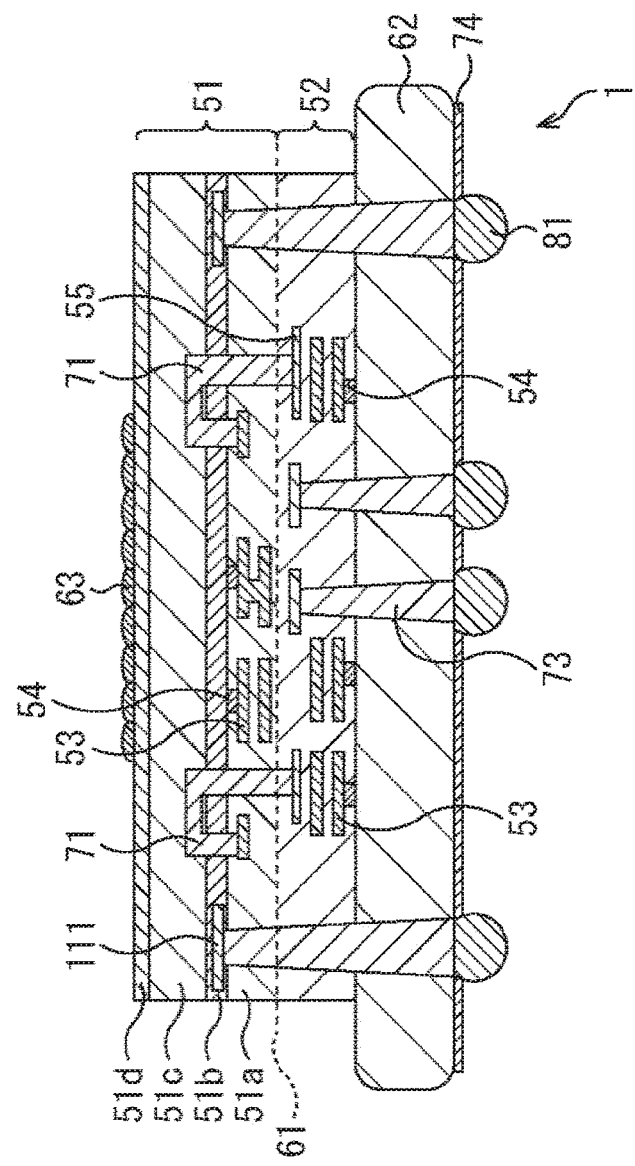
FIG. 9 is a cross-sectional view illustrating another structure example of the solid-state image sensor to which the present technology is applied.

In contrast, the solid-state image sensor 1 in FIG. 9 is common to the solid-state image sensor 1 in FIG. 6 in producing the TSV 73, pulling out the electrode to the back surface on the logic side, and forming the solder hall 81 on the electrode. Meanwhile, the solid-state image sensor 1 in FIG. 9 is different from the solid-state image sensor 1 in FIG. 6 in that the TSV 73 goes through a low-K layer that is an interlayer film of the logic wafer 52 and is in direct contact with an Al PAD 111 formed in the CIS wafer 51, instead of the PAD 55 of the logic wafer 52.

Note that the low-k material used for the interlayer film of the logic wafer 52 is used for reducing the capacitance between the multilayer wirings connecting the semiconductor elements, and refers to a material having lower relative dielectric constant than SiO2 (relative dielectric constant of 3.9 to 4.5).

Furthermore, the low-k material may be a porous insulating film. Examples of the porous insulating film include a material which SiO2 is made porous to make the relative dielectric constant small, hydrogen silsesquioxane (HSQ), organic silica, SiOC (Plank Diamond™, CORAL™, Aurora™), and the like.

As described above, in the solid-state image sensor 1 in FIG. 9, the TSV formed from the back surface of the CIS/logic devices is brought to go through the low-K layer on the logic side and in direct contact with the AL PAD, whereby the CSP creation can be performed even in a case where design change is not performed for the wiring on the logic side or the like.

Another Example of Manufacturing Processing

Figure 10:
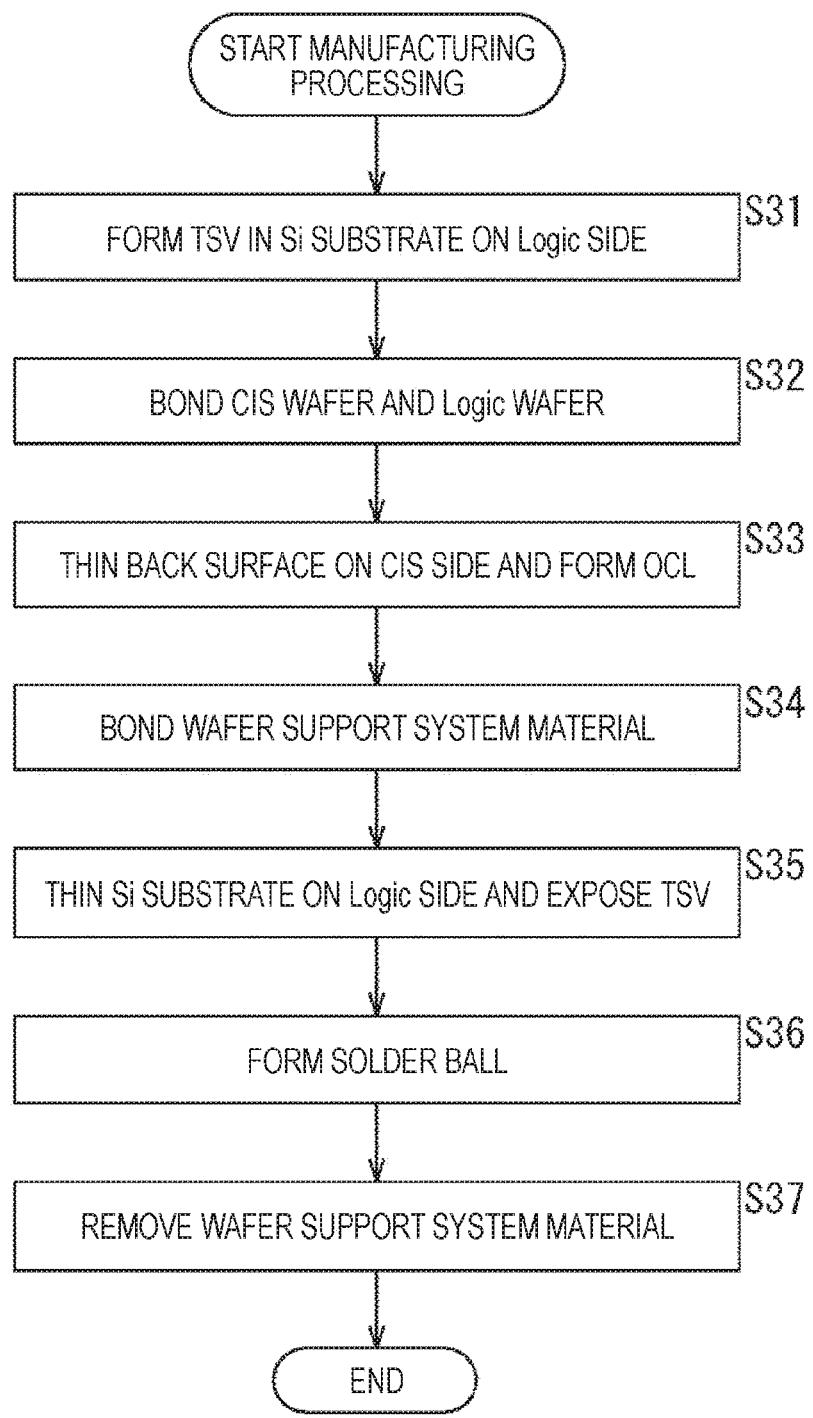
FIG. 10 is a flowchart for describing processing of manufacturing a solid-state image sensor.
Figure 11:
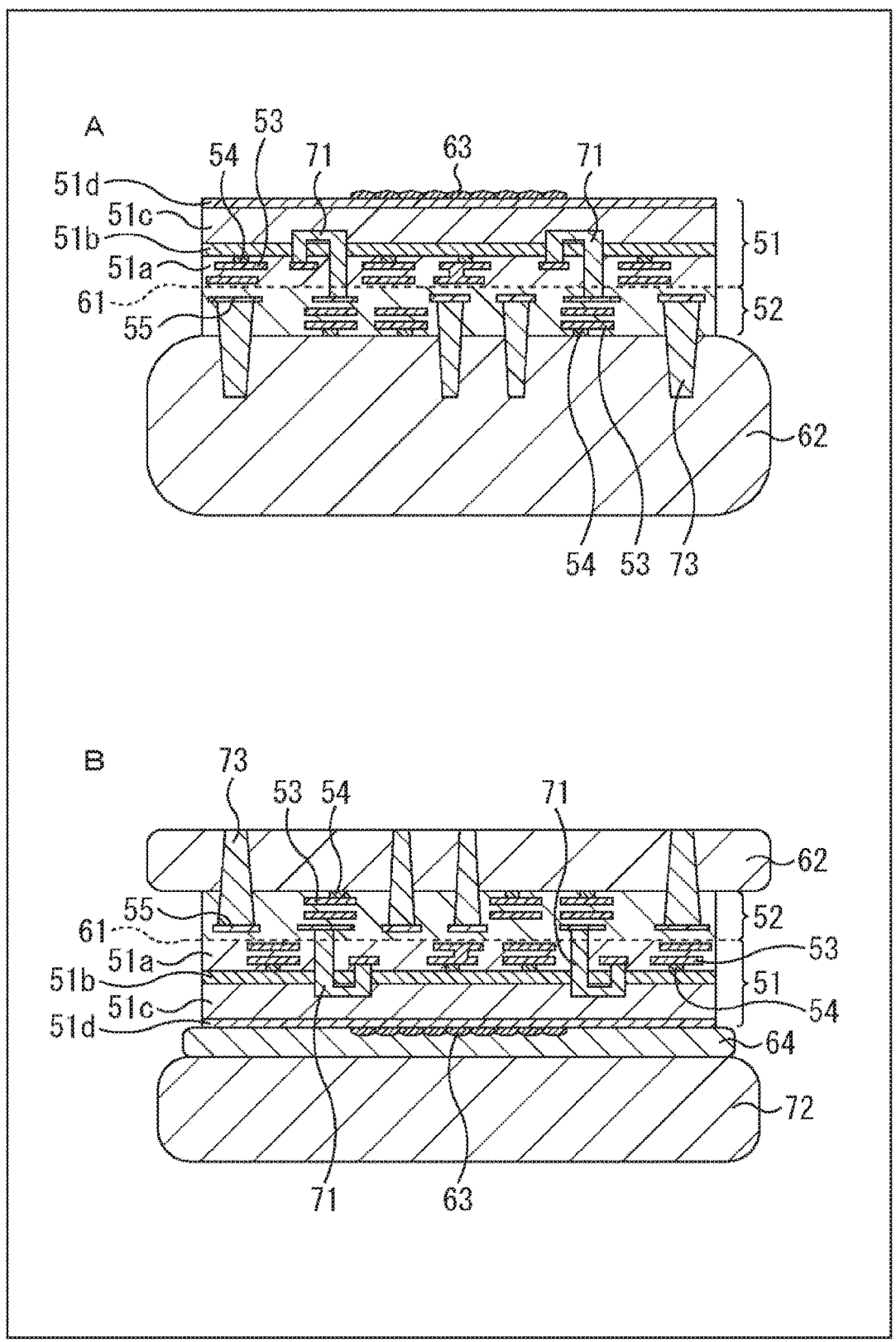
FIG. 11 is a process chart of the processing of manufacturing a solid-state image sensor.
Figure 12:
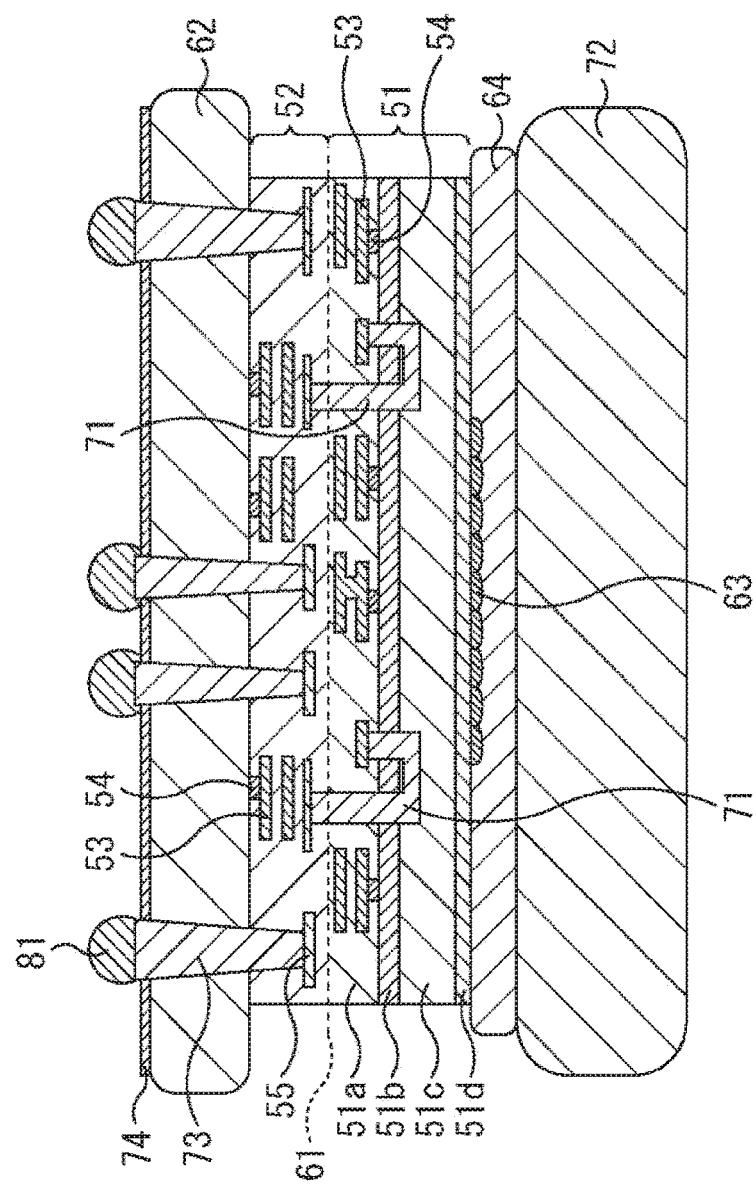
FIG. 12 is a process chart of the processing of manufacturing a solid-state image sensor.
Figure 13:
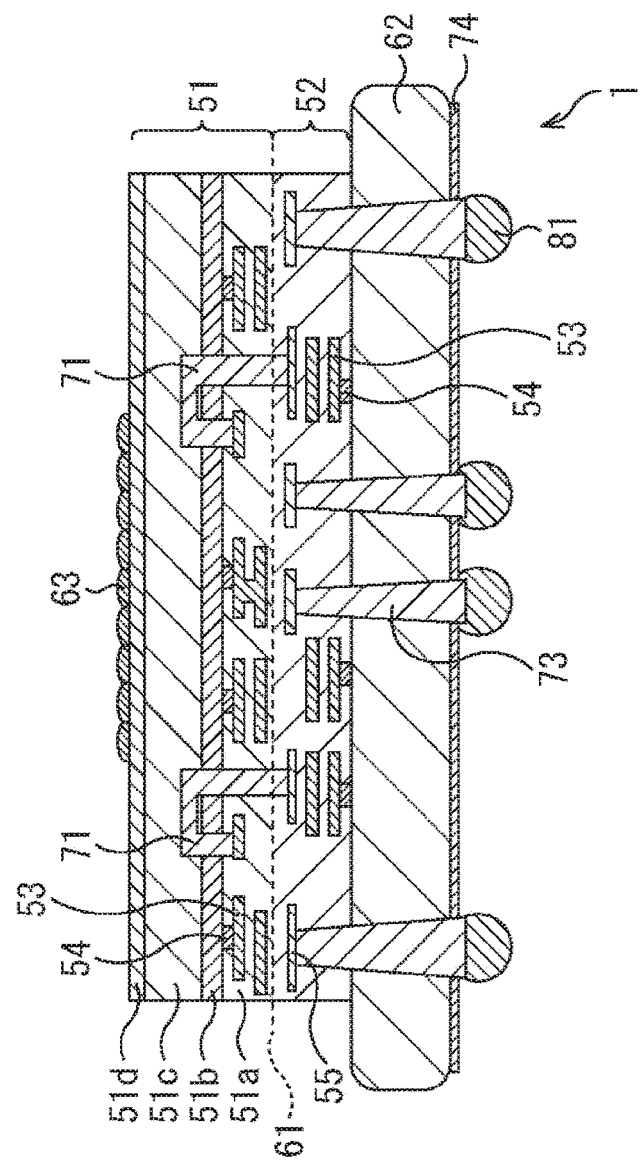
FIG. 13 is a process chart of the processing of manufacturing a solid-state image sensor.

Next, another processing of manufacturing the solid-state image sensor in FIG. 2 will be described with reference to the flowchart in FIG. 10. Note that this manufacturing processing is performed by a manufacturing apparatus, and the process charts in FIGS. 11 to 13 are appropriately referred to in the description.

In step S31, the manufacturing apparatus forms the TSV 73 in advance on the Si substrate 62 side of the logic wafer 52.

In step S32, the manufacturing apparatus bonds the CIS wafer 51 and the logic wafer 52. At that time, the manufacturing apparatus secures conduction, using the through electrode 71 connected to the wiring 53 of the CIS wafer 51 and the PAD 55 of the logic wafer 52.

In step S33, the manufacturing apparatus thins the back surface on the CIS wafer 51 side (hereinafter also referred to as CIS side) and forms the CCL 63 on the back surface on the CIS side (A in FIG. 11).

In step S34, the manufacturing apparatus bonds the wafer support system material 72 to the OCL 63 surface on the CIS side with the adhesive 64 (B in FIG. 11).

Then, in step S35, the manufacturing apparatus polishes the Si substrate 62 on the logic side to thin the Si substrate 62 and expose the ISV 73. Note that, at that time, the planarization processing for the insulating film 74 is also performed.

In step S36, the manufacturing apparatus forms the solder ball 81 on the electrode pulled out to the back surface on the logic side (FIG. 12).

In step S37, the manufacturing apparatus removes the wafer support system material 72 from the CCL 63 surface on the CIS side, and completes the solid-state image sensor 1 as illustrated in FIG. 13.

As described above, in the solid-state image sensor 1 in FIG. 13, the TSV is formed in advance on the logic side, the CIS and logic wafers are bonded together and conduction is secured using the through electrode, the wafer support system material is bonded to the CCL surface on the CIS side, the Si substrate on the logic side is polished, and the TSV is exposed at the same time with thinning of the Si substrate, whereby formation of the TSV becomes easy. Furthermore, a finer TSV can be produced with a high yield.

Another Structure Example of Solid-State Image Sensor

Figure 14:
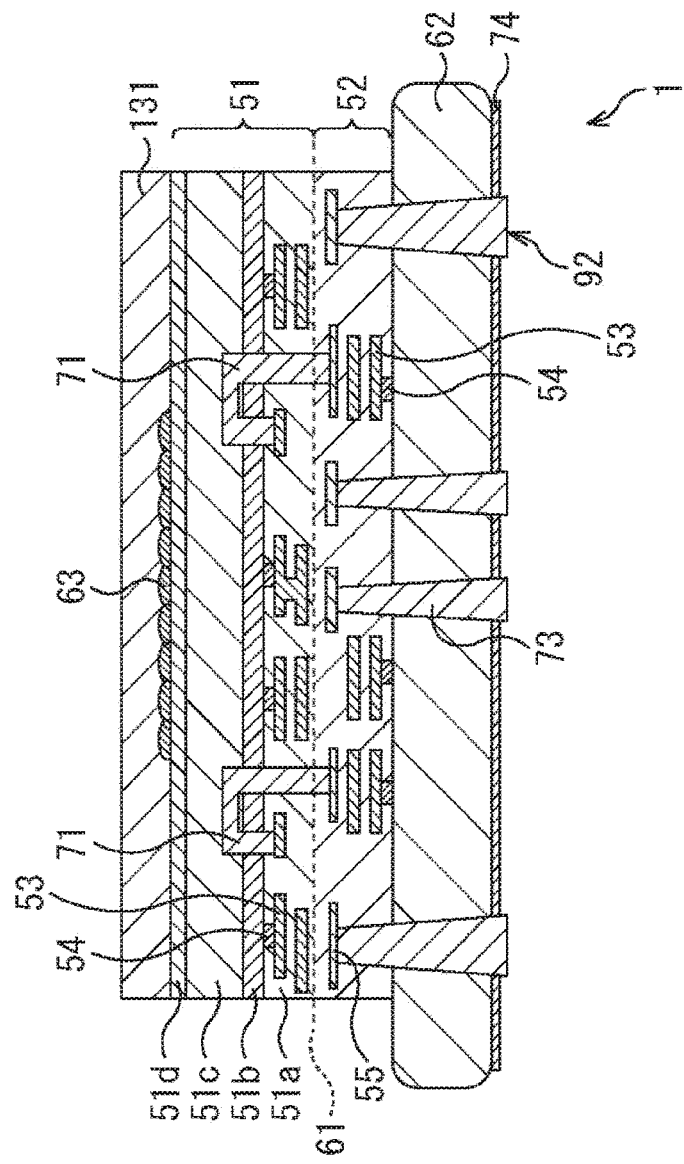
FIG. 14 is a cross-sectional view illustrating a structure example of the solid-state image sensor manufactured by the manufacturing processing in FIG. 10.

FIG. 14 is a cross-sectional view illustrating another structure example of the solid-state image sensor to which the present technology is applied.

The solid-state image sensor 1 in FIG. 14 is common to the solid-state image sensor 1 in FIG. 7 up to removing the wafer support system material 72 from the OCL 63 surface on the CIS side. Meanwhile, the solid-state image sensor 1 in FIG. 8 is different from the solid-state image sensor 1 in FIG. 7 in directly forming an optical function film 131 on the surface of the OCL 63 after removal of the wafer support system material 72.

Note that the optical function film 131 contains, for example, an IR cut filter and AR coating, or a wafer level lens. The order of forming the Al coating and the IR cut filter differs depending on a device, and both of an order of the AR coating and the IR cut filter and an order of the IR cut filter and the AR coating from the side closer to the photoelectric conversion element are selectable.

As described above, in the solid-state image sensor 1 in FIG. 14, the IR cut filter or the AR code, or the wafer level lens is directly formed on the OCL surface on the CSP after removal of the wafer support system material, whereby an optical function can be further added at the same time with thinning the CSP.

Another Example of Manufacturing Processing

Figure 15:
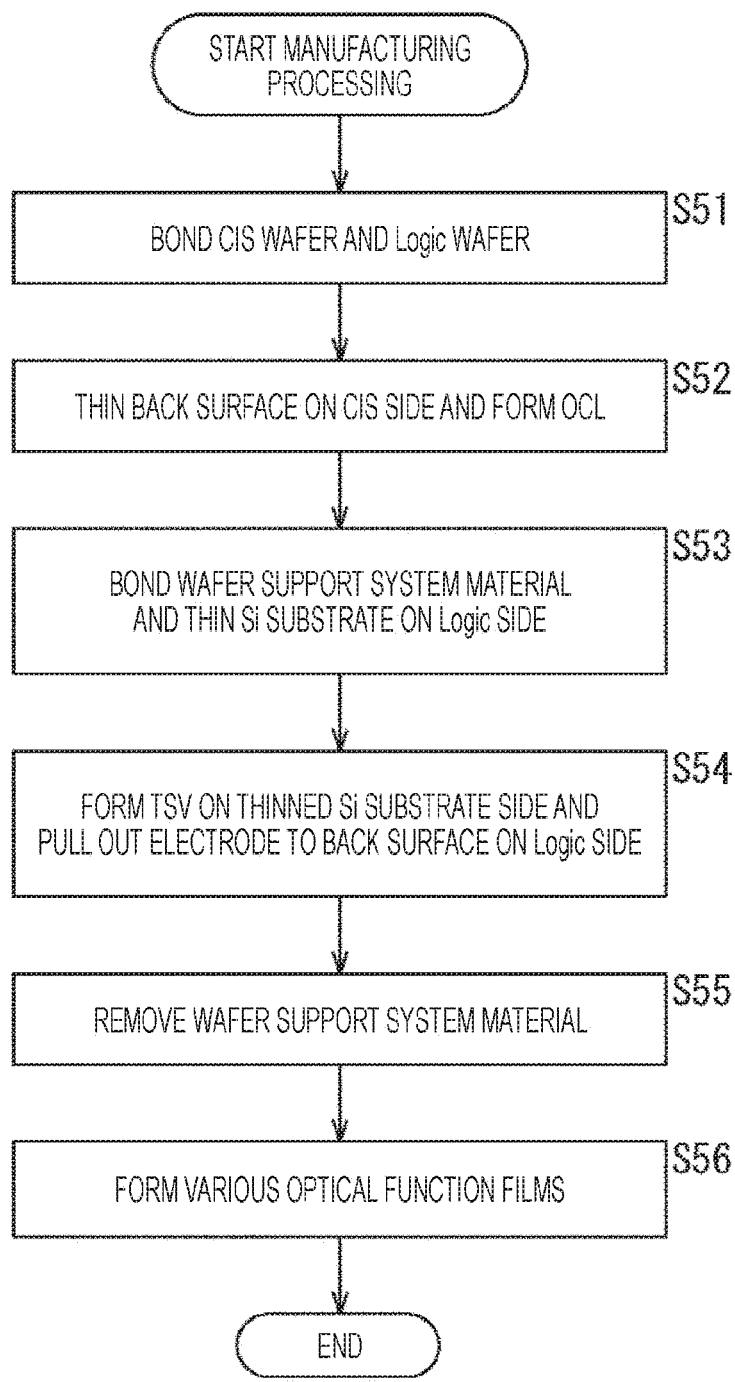
FIG. 15 is a flowchart for describing processing of manufacturing a solid-state image sensor.
Figure 17:
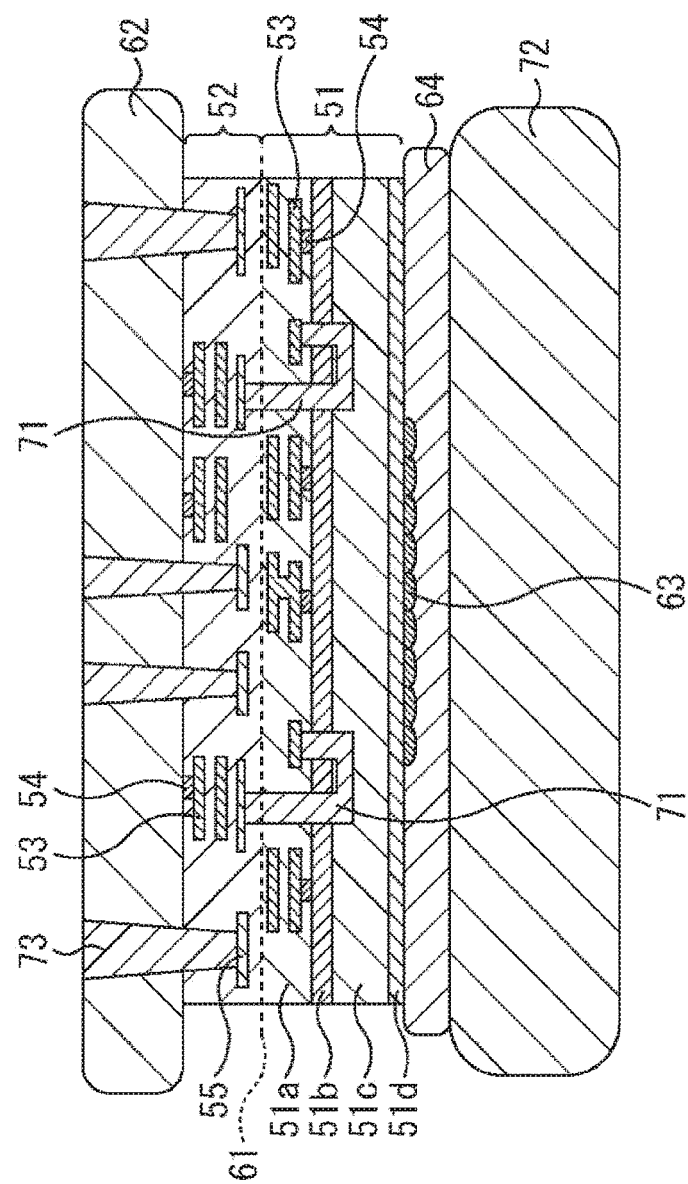
FIG. 17 is a process chart of the processing of manufacturing a solid-state image sensor.
Figure 18:
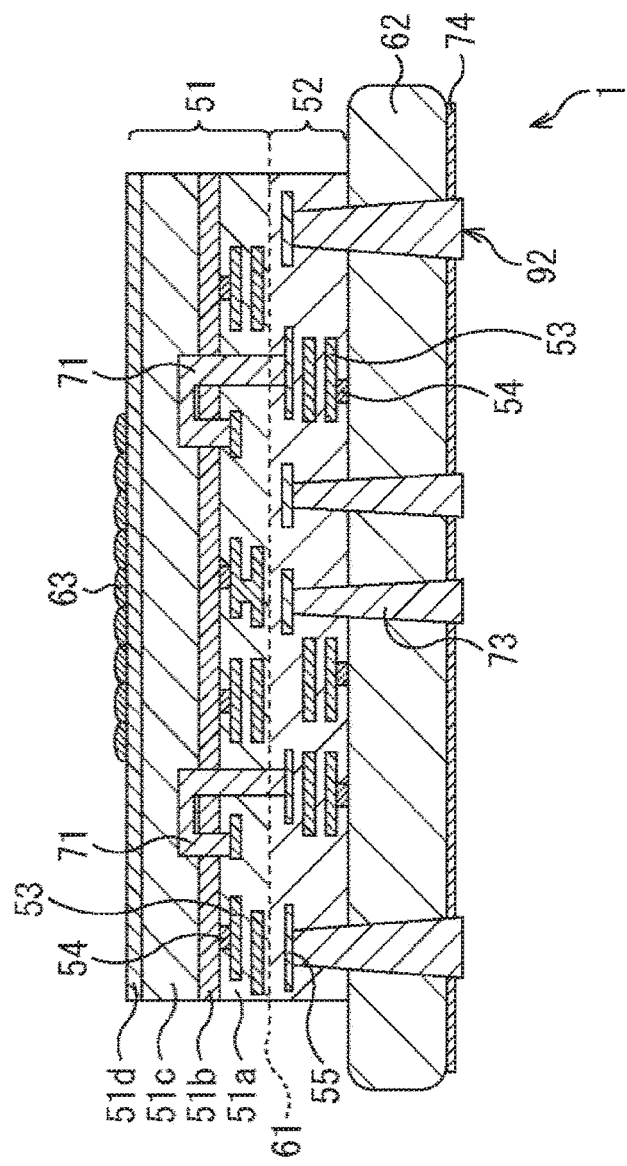
FIG. 18 is a process chart of the processing of manufacturing a solid-state image sensor.

Next, another processing of manufacturing the solid-state image sensor in FIG. 2 will be described with reference to the flowchart in FIG. 15. Note that this manufacturing processing is performed a manufacturing apparatus, and the process charts in FIGS. 16 to 18 are appropriately referred to in the description.

In step S51, the manufacturing apparatus bonds the CIS wafer 51 and the logic wafer 52. At that time, the manufacturing apparatus secures conduction, using the through electrode 71 connected to the wiring 53 of the CIS wafer 51 and the PAD 55 of the logic wafer 52.

Figure 16:
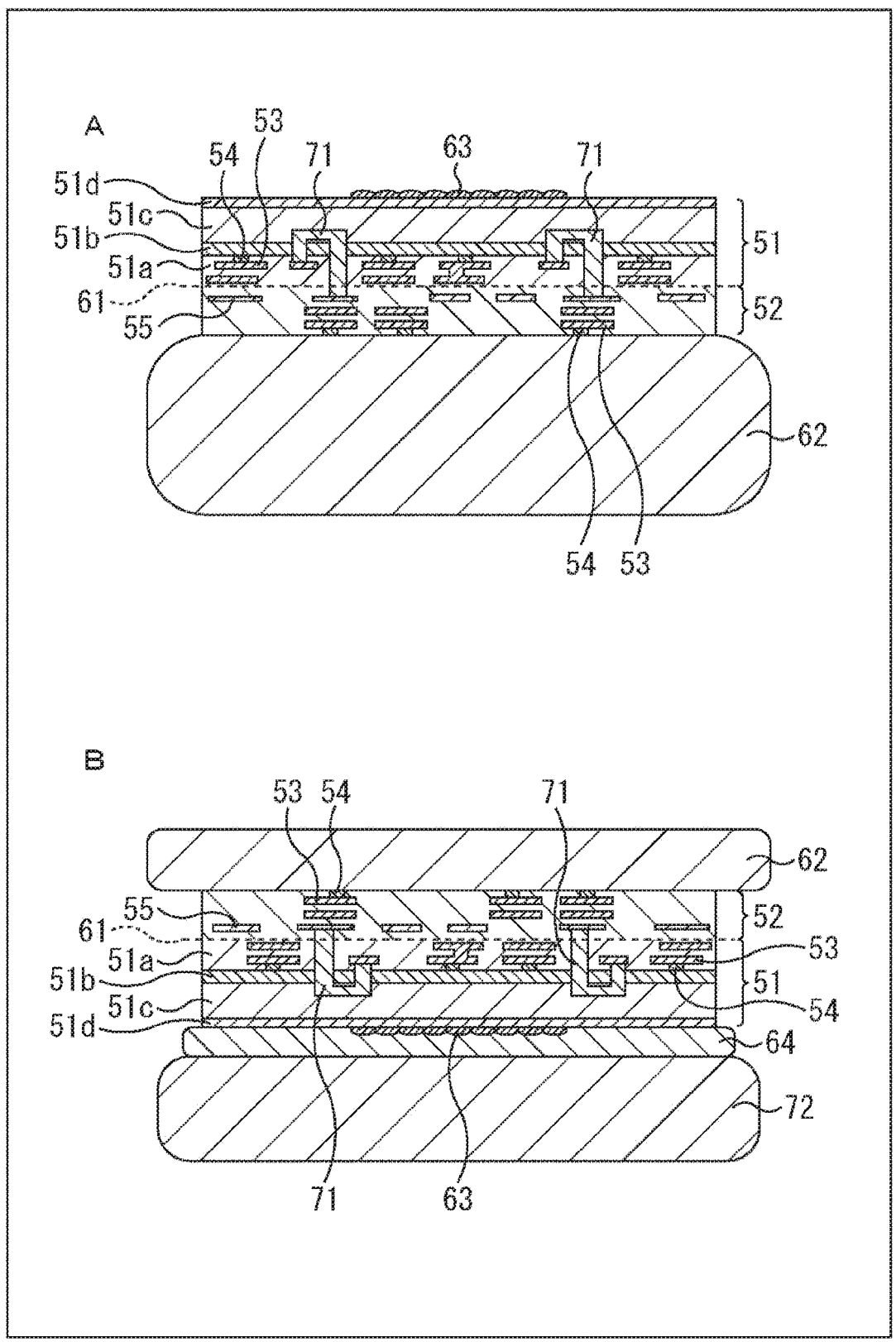
FIG. 16 is a process chart of the processing of manufacturing a solid-state image sensor.

In step S52, the manufacturing apparatus thins the back surface on the CIS side and forms the CCL 63 on the back surface on the CIS side after bonding (A in FIG. 16).

In step S53, the manufacturing apparatus bonds the wafer support system material 72 on the CCL 63 surface on the CIS side with the adhesive 64, polishes the Si substrate 62 on the logic side to thin the Si substrate 62 (B in FIG. 16).

In step S54, the manufacturing apparatus produces, in the thinned Si substrate 62, the TSV 73 to be connected to the PAD 55 to be formed in the logic wafer 52, and pulls out the electrode to the back surface on the logic side (FIG. 17). Note that, at that time, the planarization processing for the insulating film 74 is also performed.

In step S55, the manufacturing apparatus removes the wafer support system material 72 from the OCL 63 surface on the CIS side (FIG. 18).

Figure 19:
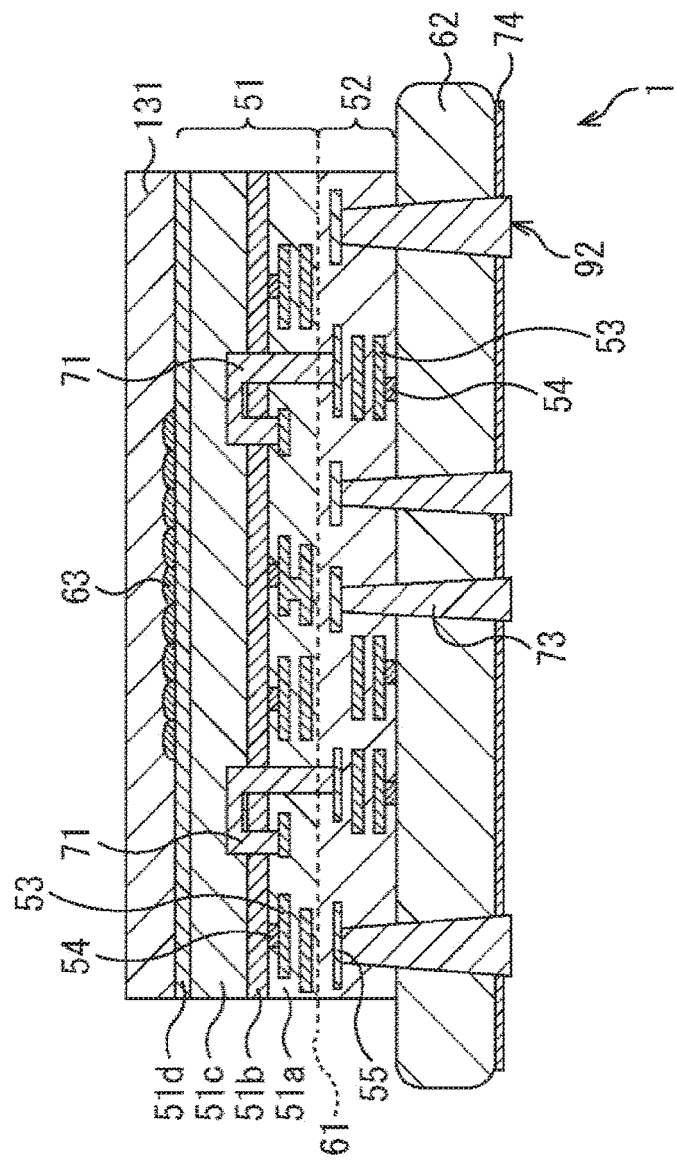
FIG. 19 is a cross-sectional view illustrating a structure example of the solid-state image sensor manufactured by the manufacturing processing in FIG. 15.

In step S56, the manufacturing apparatus forms various optical functional films 131, and completes the solid-state image sensor 1 as illustrated in FIG. 19.

Note that formation of the various optical functional films (the IR cut filter and the AR coating) 131 is performed by spin coating, dispensing, vapor deposition, or the like. Furthermore, the wafer level lens is produced by injection molding or imprinting. Alternatively, the created wafer level lens may be brought to adhere onto the OCL 63.

As described above, in the solid-state image sensor 1 in FIG. 19, the wafer support system material is removed, and the formation of the various optical function films is performed by spin coating, dispensing, vapor deposition, or the like, whereby a material with lower cost and lower heat resistance becomes applicable. Furthermore, the wafer level lens is produced by injection type, imprinting, or the like. Alternatively, adoption of the structure that allows the created wafer level lens to adhere onto the CCL enables production of a device with high alignment accuracy by focusing or the like.

2. Usage Examples of Image Sensor

Figure 20:
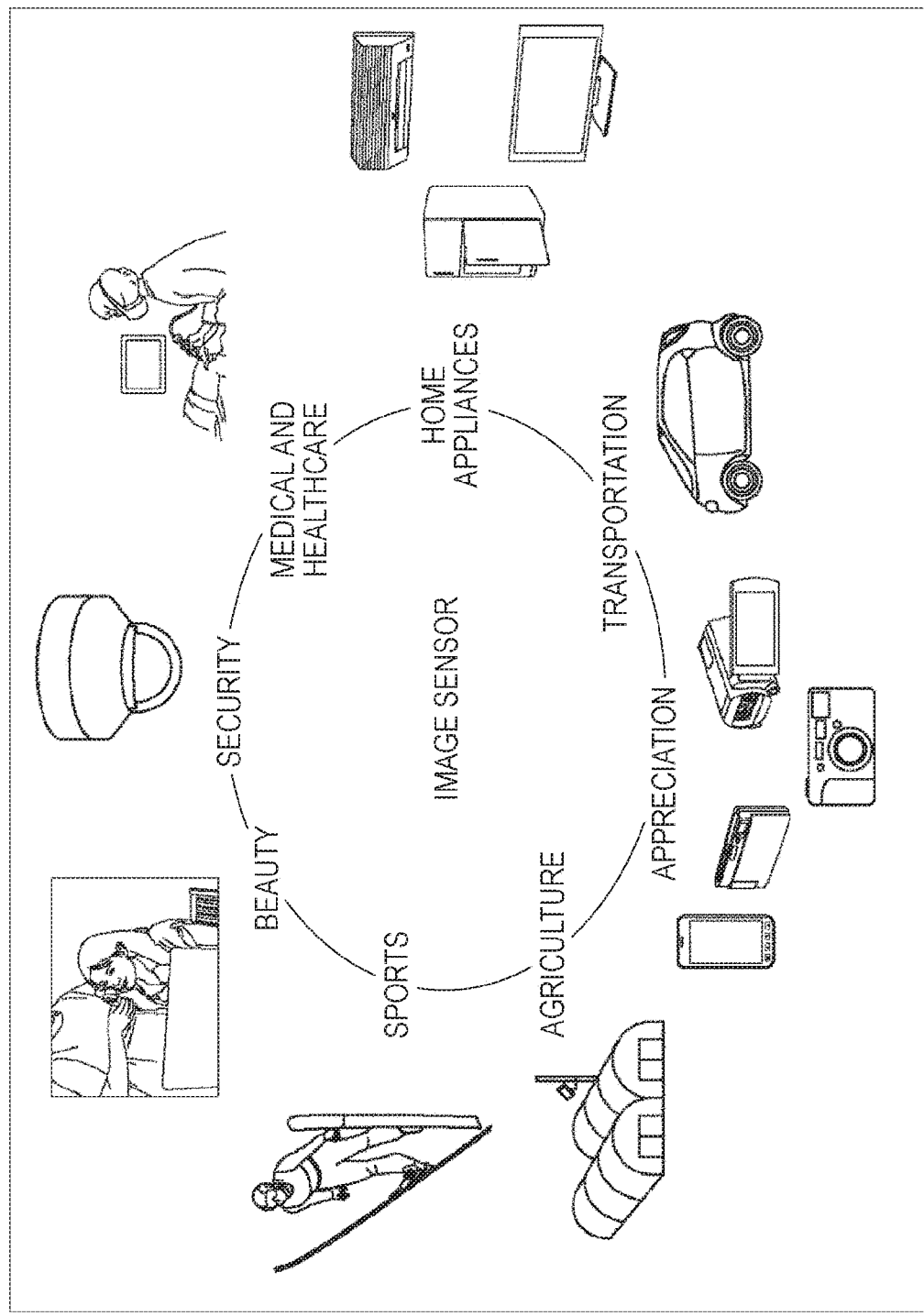
FIG. 20 is a diagram illustrating use examples of an image sensor to which the present technology is applied.

FIG. 20 is a diagram illustrating use examples of the above-described solid-state image sensor.

The above-described solid-state image sensor (image sensor) can be used in various cases for sensing light such as visible light, infrared light, ultraviolet light, and X-ray, as described below, for example.

- Devices that capture images provided for appreciation use, such as digital cameras and mobile devices with a camera function.
- Devices provided for transportation, such as in-vehicle sensors that capture the front, rear, peripheries, an interior of the vehicle, etc, for safe driving such as automatic stop, recognition of a state of a driver, or the like, monitoring cameras that monitor traveling vehicles and roads, distance measuring sensors that measure a distance between vehicles, and the like
- Devices provided for home appliances such as TVs, refrigerators, air conditioners, etc. to capture gestures of users and perform device operations according to the gestures
- Devices provided for medical and healthcare, such as endoscopes, devices that perform angiography by receiving infrared light, and the like
- Devices provided for security, such as monitoring cameras for crime prevention and cameras for person authentication use
- Devices for beauty, such as skin measuring instruments that capture skin and microscopes that capture scalp
- Devices provided for sports or the like, such as action cameras and wearable cameras for sport use
- Devices provided for agriculture, such as cameras for monitoring the condition of fields and crops

3. Example of Electronic Device

Configuration Example of Electronic Device

Moreover, the present technology is not limited to application to the solid-state image sensor and is applicable to an imaging device. Here, the imaging device refers to a camera system such as a digital still camera or a digital video camera, or an electronic device having an imaging function such as a mobile phone. Note that there are cases where a module form mounted on an electronic device, that is, a camera module is referred to as the imaging device.

Here, a configuration example of the electronic device according to the present technology will be described with reference to FIG. 21.

Figure 21:
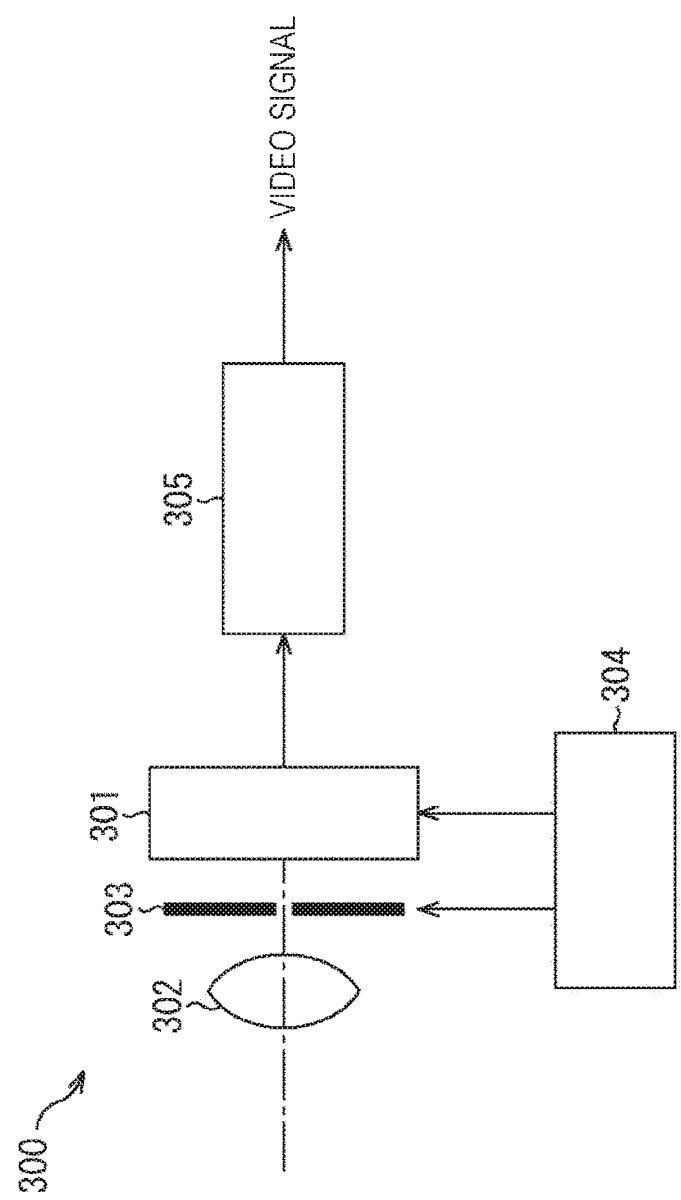
FIG. 21 is a block diagram illustrating a configuration example of an electronic device to which the present technology is applied.

An electronic device 300 illustrated in FIG. 21 includes a solid-state image sensor (element chip) 301, an optical lens 302, a shutter device 303, a drive circuit 304, and a signal processing circuit 305. As the solid-state image sensor 301, the above-described solid-state image sensor 1 of the present technology is provided.

The optical lens 302 forms image light (incident light) from an object on an imaging surface of the solid-state image sensor 301. With the imaging, a signal charge is accumulated in the solid-state image sensor 301 for a fixed period. The shutter device 303 controls a light irradiation period and a light shielding period for the solid-state image sensor 301.

The drive circuit 304 supplies drive signals for controlling a signal transfer operation of the solid-state image sensor 301, a shutter operation of the shutter device 303, and a light emission operation of a light emission unit (not illustrated). The drive circuit 304 controls the operations using parameters set by a central processing unit (CPU) (not illustrated). The solid-state image sensor 301 transfers a signal by the drive signal (timing signal) supplied from the drive circuit 304. The signal processing circuit 305 performs various types of signal processing for the signal output from the solid-state image sensor 301. A video signal for which the signal processing has been performed is stored in a storage medium such as a memory or is output to a monitor.

4. Application Example to Endoscope Surgery System

The technology according to the present disclosure (present technology) can be applied to various products. For example, the technology according to the present disclosure may be applied to an endoscope surgery system.

Figure 22:
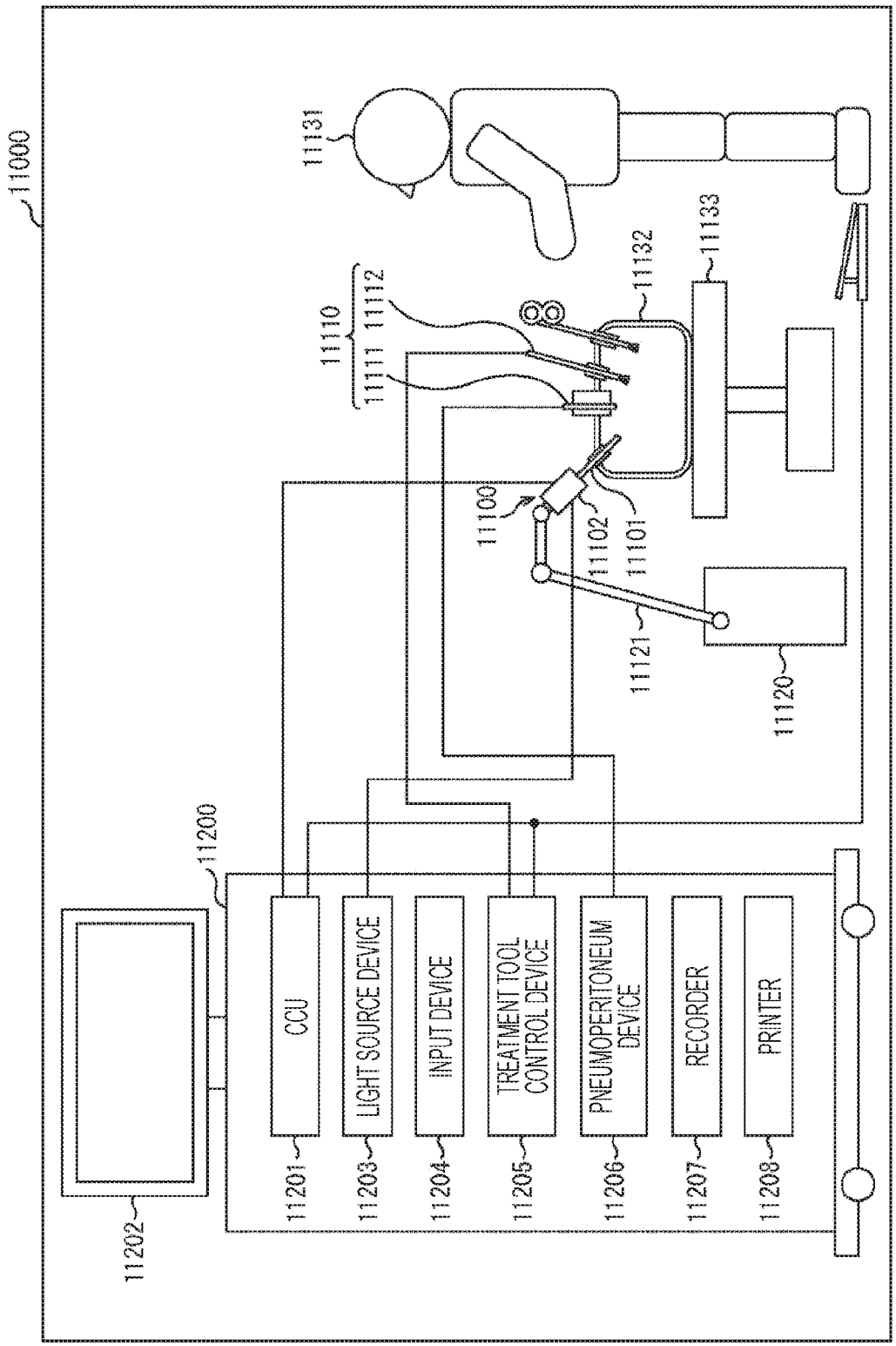
FIG. 22 is a diagram illustrating an example of a schematic configuration of an endoscope surgery system.

FIG. 22 is a diagram illustrating an example of a schematic configuration of an endoscope surgery system to which the technology according to the present disclosure (present technology) is applicable.

FIG. 22 illustrates a state in which an operator (doctor) 11131 is performing an operation on a patient 11132 on a patient, bed 11133, using an endoscope surgery system 11000. As illustrated in FIG. 22, the endoscope surgery system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 22 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel 11101 and an observation target in the body cavity of the patient 11132 is irradiated with the light through the object lens. Note that the endoscope 11100 may be a direct-viewing endoscope, may be an oblique-viewing endoscope, or may be a side-viewing endoscope.

An optical system and an imaging element are provided inside the camera head 11102, and reflected light (observation light) from the observation target is condensed to the imaging element by the optical system. The observation light is photoelectrically converted by the imaging element, and an electrical signal corresponding to the observation light, that is, an image signal corresponding to an observed image is generated. The image signal is transmitted to a camera control unit (CCU) 11201 as raw data.

The CCU 11201 includes a central processing unit (CPU), a graphics processing unit (GPU), and the like, and generally controls an operation of the endoscope 11100 and a display device 11202. Moreover, the CCU 11201 receives the image signal from the camera head 11102, and applies various types of image processing for displaying an image based on the image signal, such as developing processing (demosaicing processing), to the image signal, for example.

The display device 11202 displays the image based on the image signal to which the image processing has been applied by the CCU 11201, by control of the CCU 11201.

The light source device 11203 is configured by a light source such as a light emitting diode (LED), for example, and supplies irradiation light to the endoscope 11100 in capturing an operation portion or the like.

An input device 11204 is an input interface for the endoscope surgery system 11000. A user can input various types of information and instructions to the endoscope surgery system 11000 through the input device 11204. For example, the user inputs an instruction to change imaging conditions (a type of irradiation light, a magnification, a focal length, and the like) by the endoscope 11100, and the like.

A treatment tool control device 11205 controls driving of the energy treatment tool 11112, for cauterizing or incising a tissue, sealing a blood vessel, and the like. A pneumoperitoneum device 11206 sends a gas into the body cavity of the patient 11132 through the pneumoperitoneum tube 11111 to expand the body cavity for the purpose of securing a field of vision by the endoscope 11100 and a work space for the operator. A recorder 11207 is a device that can record various types of information regarding the surgery. A printer 11208 is a device that can print the various types of information regarding the surgery in various formats such as a test, an image, and a graph.

Note that the light source device 11203 that supplies the irradiation light in capturing the operation portion to the endoscope 11100 can be configured from a white light source configured from an LED, a laser Lght source, or a combination of the LED and the laser light source, for example. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Furthermore, in this case, the observation target is irradiated with the laser light from each of the RGB laser light sources in a time division manner, and the driving of the imaging element of the camera head 11102 is controlled in synchronization with the irradiation timing, so that images respectively corresponding to RGB can be captured in a time division manner. According to the method, a color image can be obtained without providing a color filter to the imaging element.

Furthermore, driving of the light source device 11203 may be controlled to change intensity of light to be output every predetermined time. The driving of the imaging element of the camera head 11102 is controlled in synchronization with change timing of the intensity of light and images are acquired in a time division manner, and the images are synthesized, so that a high-dynamic range image without, clipped blacks and flared highlights can be generated.

Furthermore, the light source device 11203 may be configured to be able to supply light in a predetermined wavelength band corresponding to special light observation. In the special light observation, for example, so-called narrow band imaging is performed by radiating light in a narrower band than the irradiation light (in other words, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to obtain fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image can be performed. The light source device 11203 can be configured to be able to supply narrow-band light and/or exciting light corresponding to such special light observation.

Figure 23:
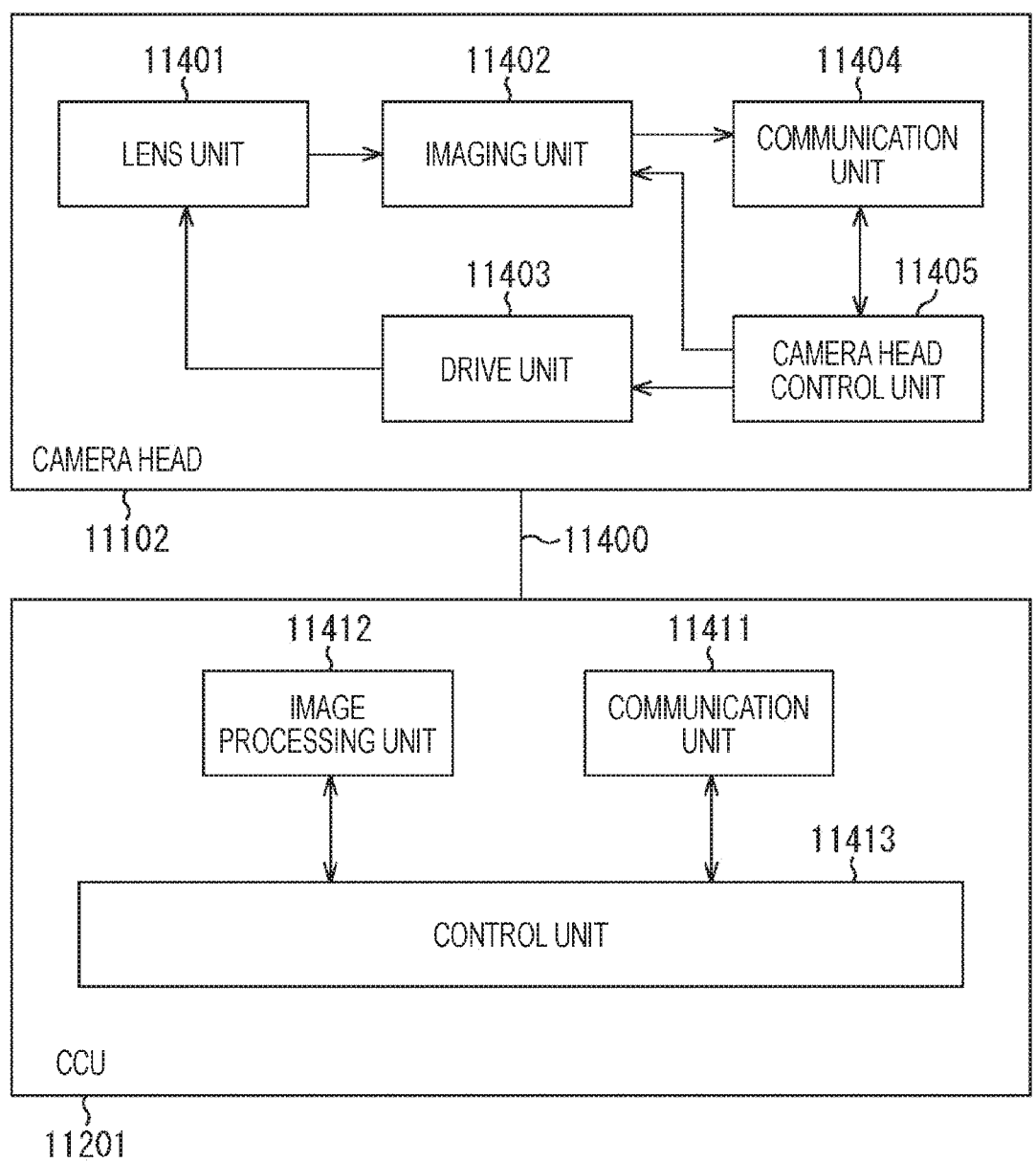
FIG. 23 is a block diagram illustrating an example of functional configurations of a camera head and a camera control unit (CCU).

FIG. 23 is a block diagram illustrating an example of functional configurations of the camera head 11102 and the CCU 11201 illustrated in FIG. 22.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured from a combination of a plurality of lenses including a zoom lens and a focus lens.

The imaging element that configures the imaging unit 11402 may be one imaging element (so-called single imaging element) or may be a plurality of imaging elements (so-called multiple imaging elements). In a case where the imaging unit 11402 is configured from multiple imaging elements, for example, a color image may be obtained by generating image signals respectively corresponding to RGB by the imaging elements and synthesizing the image signals. Alternatively, the imaging unit 11402 may include a pair of imaging elements for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured from the multiple imaging elements, a plurality of systems of the lens units 11401 may be provided corresponding to the imaging elements.

Furthermore, the imaging unit 11402 may not be necessarily provided in the camera head 11102. For example, the imaging unit 11402 may be provided immediately after the object lens inside the lens-barrel 11101.

The drive unit 11403 is configured from an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured from a communication device for transmitting or receiving various types of information to or from the CCU 11201. The communication unit 11404 transmits the image signal obtained from the imaging unit 11402 to the CCU 11201 through the transmission cable 11400 as raw data.

Furthermore, the communication unit 11404 receives a control signal for controlling driving of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image, for example.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, a so-called auto exposure (AE) function, an auto focus (AF) function, and an auto white balance (AWB) function are incorporated in the endoscope 11100.

The camera head control unit 11405 controls driving of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Furthermore, the communication unit 11411 transmits a control signal for controlling driving of the camera head 11102 to the camera head 11102. The image signal and the control signal can be transmitted through telecommunication, optical communication, or the like.

The image processing unit 11412 applies various types of image processing to the image signal as a raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling driving of the camera head 11102.

Furthermore, the control unit 11413 displays the captured image of the operation portion or the like in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as forceps, a specific living body portion, blood, mist at the time of use of the energy treatment tool 11112, or the like, by detecting a shape of an edge, a color, or the like of an object included in the captured image. The control unit 11413 may superimpose and display various types of surgery support information on the image of the operation portion, using the recognition result, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

Here, in the illustrated example, the communication has been performed in a wired manner using the transmission cable 11400. However, the communication between the camera head 11102 and the CCU 11201 may be wirelessly performed.

An example of an endoscope surgery system to which the technology according to the present disclosure is applicable has been described. The technology according to the present disclosure can be applied to the endoscope 11100, (the imaging unit 11402 of) the camera head 11102, the image processing unit 11412 of the CCU 11201, the light source device 11203, or the like, of the above-described configurations, for example. Specifically, the solid-state image sensor 1 in FIG. 1 can be applied to the imaging unit 11402, for example. By applying the technology according to the present disclosure to the imaging unit 11402 and the image processing unit 11412, a clearer image of the operation portion can be obtained. Therefore, the operator can reliably confirm the operation portion.

Note that, here, the endoscope surgery system has been described as an example. However, the technology according to the present disclosure may be applied to microsurgery or the like, for example.

5. Application Examples to Moving Body

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 24:
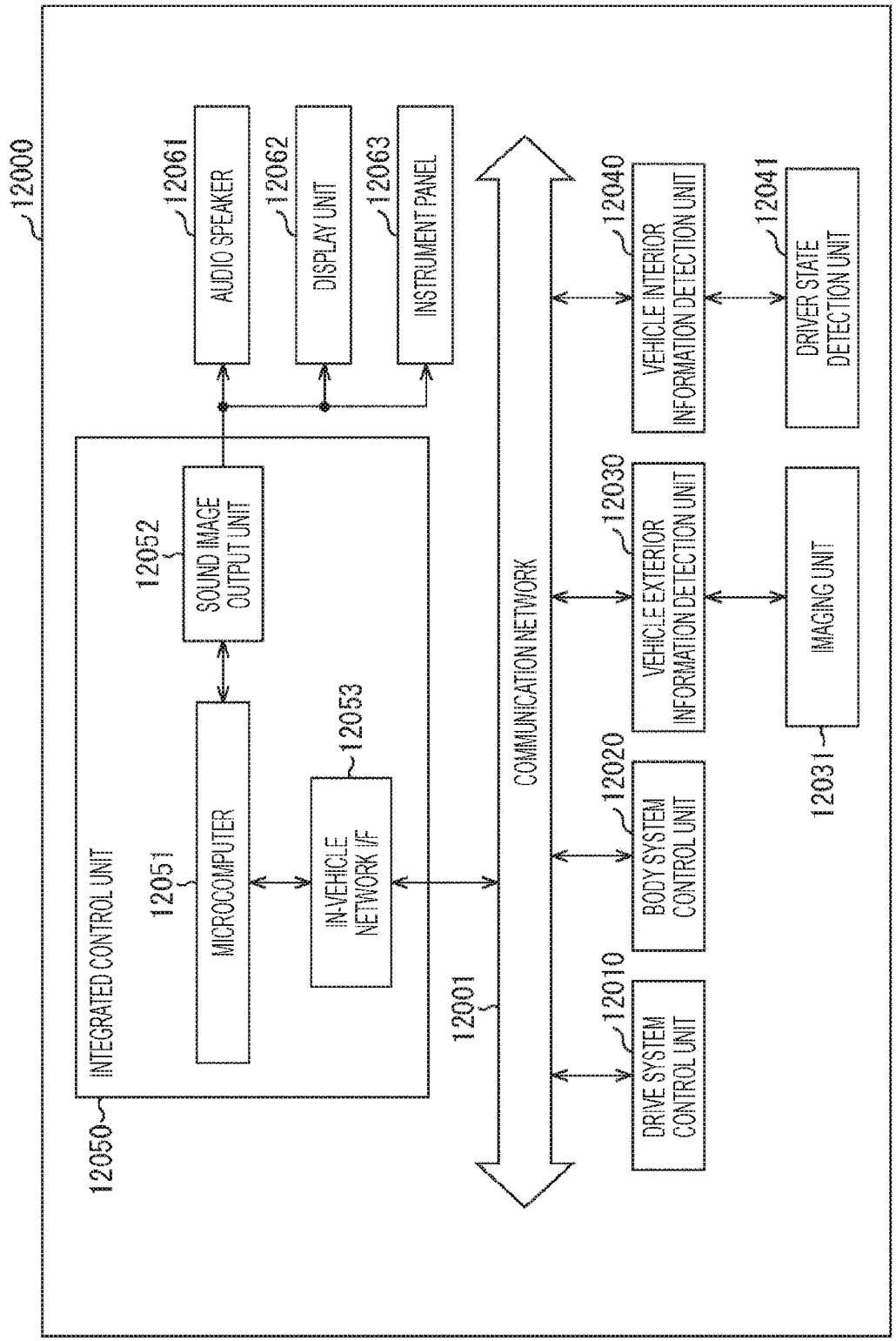
FIG. 24 is a block diagram illustrating an example of a schematic configuration of a vehicle control system.

FIG. 24 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 24, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters, or the like on a road surface on the basis of the received image.

The imaging unit 12031 is an optical sensor that receives light and outputs an electrical signal according to the amount of received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether the driver fails asleep on the basis of the detection information input from the driver state detection unit 12041.

The microcomputer 12051 calculates a control target value of the drive power generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on arm inter-vehicle distance, vehicle speed maintaining travel, collision warning of the vehicle, lane out warning of the vehicle, and the like.

Furthermore, the microcomputer 12051 controls the drive power generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic driving of autonomous travel without depending on an operation of the driver or the like.

Furthermore, the microcomputer 12051 can output a control command to the body system control unit 12030 on the basis of the information outside the vehicle acquired in the vehicle exterior information detection unit 12030. For example, the microcomputer 12051 can perform cooperative control for the purpose of achievement of non-glare by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 24, as the output device, an audio speaker 12061, a display unit 12062, and an instrument panel 12063 are illustrated. The display unit 12062 may include, for example, at least one of an on-board display or a head-up display.

Figure 25:
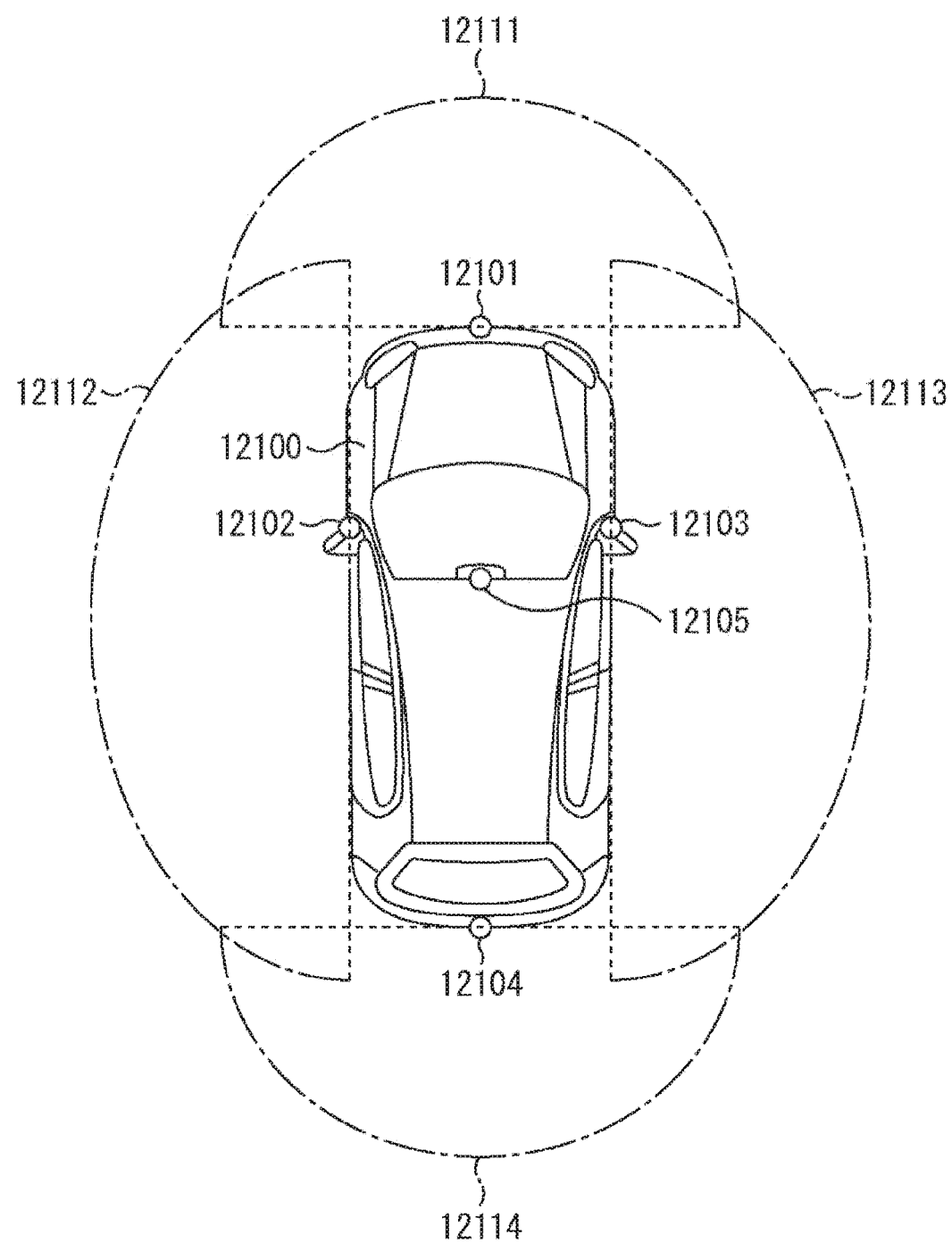
FIG. 25 is an explanatory diagram illustrating an example of installation positions of a vehicle exterior information detection unit and an imaging unit.

FIG. 25 is a diagram illustrating an example of installation positions of the imaging unit 12031.

In FIG. 25, as the imaging unit. 12031, imaging units 12101, 12102, 12103, 12104, and 12105 are included.

The imaging units 12101, 12102, 12103, 12104, and 12105 are provided at positions such as a front nose, side mirrors, a rear bumper, a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 25 illustrates an example of imaging ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured in the imaging units 12101 to 12104.

At least one of the imaging units 12101 to 12104 may have a function to acquire distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control), automatic acceleration control (including following start control), and the like. In this way, the cooperative control for the purpose of automatic driving of autonomous travel without depending on an operation of the driver or the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. Then, the microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. The recognition of a pedestrian is performed by a process of extracting characteristic points in the captured images of the imaging units 12101 to 12104, as the infrared camera, for example, and by a process of performing pattern matching processing for the series of characteristic points indicating a contour of an object and discriminating whether or not the object is a pedestrian. When the microcomputer 12051 determines that a pedestrian exists in the captured images of the imaging units 12101 to 12104 and recognizes the pedestrian, the sound image output unit 12052 controls the display unit 12062 to superimpose and display a square contour line for emphasis on the recognized pedestrian. Furthermore, the sound image output unit 12052 may control the display unit 12062 to display an icon or the like representing the pedestrian at a desired position.

An example of a vehicle control system to which the technology according to the present disclosure is applicable has been described. The technology according to the present disclosure is applicable to the imaging unit 12031 (including the imaging units 12101 to 12104), of the above-described configurations. Specifically, the solid-state image sensor 1 in FIG. 1 can be applied to the imaging unit 12031, for example. By applying the technology according to the present disclosure to the imaging unit 12031, a special effect of obtaining clearer images in an in-vehicle device can be obtained, for example.

Note that, in the present specification, the steps describing the above-described series of processing include not only the processing performed in a time-series manner according to the described order but also processing executed in parallel or individually even if the processing is not necessarily performed in a time-series manner.

Furthermore, embodiments in the present disclosure are not limited to the above-described embodiments, and various modifications can be made without departing from the gist of the present disclosure.

Furthermore, in the above description, the configuration described as one device (or processing unit) may be divided into and configured as a plurality of devices (or processing units). On the contrary, the configuration described a plurality of devices (or processing units) may be collectively configured as one device (or processing unit). Furthermore, a configuration other than the above-described configuration may be added to the configuration of each device (or each processing unit). Moreover, a part of the configuration of a certain device (or processing unit) may be included in the configuration of another device (or another processing unit) as long as the configuration and operation of the entire system are substantially the same. That is, the present technology is not limited to the above-described embodiments, and various modifications can be made without departing from the gist of the present technology.

The favorable embodiments of the present disclosure have been described in detail with reference to the accompanying drawings. However, the disclosure is not limited to such examples. It is obvious that various alterations and modifications can be conceived by those having ordinary knowledge in the technical field to which the present disclosure belongs within the scope of the technical idea described in the claims, and it is understood that these alterations and modifications also naturally belong to the technical scope of the present disclosure.

Note that the present technology can also have the following configurations.

(1) A solid-state image sensor including:
  a first semiconductor element including a pixel including a photoelectric conversion element;
  a second semiconductor element including a logic circuit or a memory circuit and stacked with and bonded to the first semiconductor element;
  a through electrode electrically connecting the first semiconductor element and the second semiconductor element;
  an external electrode formed as an external output, using a through-silicon via (TSV) formed from a back surface side of the thinned second semiconductor element; and
  a wafer support system material bonded on a lens after formation of the lens on a light receiving surface of the first semiconductor element, and separated from the light receiving surface after formation of the external electrode.

(2) The solid-state image sensor according to (1), in which the external electrode is a planarized Cu electrode.

(3) The solid-state image sensor according to (1), in which the external electrode is an NiAu electrode.

(4) The solid-state image sensor according to any one of (1) to (3), in which the TSV formed from the back surface side of the second semiconductor element goes through a low-K and is connected with an Al pad of the first semiconductor element.

(5) The solid-state image sensor according to any one of (1) to (3), in which
the TSV is formed after the first semiconductor element and the second semiconductor element are bonded together.

(6) The solid-state image sensor according to any one of (1) to (3), in which
the TSV is formed before the first semiconductor element and the second semiconductor element are bonded together.

(7) The solid-state image sensor according to any one of (1) to (6), in which
an optical function film is firmed on the lens of the first semiconductor element.

(8) The solid-state image sensor according to (7), in which the optical function film is an IR cut filter and AR coating, or a wafer level lens.

(9) The solid-state image sensor according to (7), in which the optical function film is formed after the wafer support system material is separated from the light receiving surface of the first semiconductor element.

(10) The solid-state image sensor according to any one of (1) to (9), in which
a thickness of the wafer support system material is equal to or larger than 300 um.

(11) The solid-state image sensor according to any one of (1) to (10), in which
the wafer support system material contains a glass substrate or an Si substrate.

(12) A manufacturing method in which a manufacturing apparatus:
stacks and bonds a first semiconductor element including a pixel including a photoelectric conversion element and a second semiconductor element including a logic circuit or a memory circuit;
electrically connects the first semiconductor element and the second semiconductor element via a through electrode;
bonds a wafer support system material on a lens after formation of the lens on a light receiving surface of the first semiconductor element;
forms an external electrode for an external output, using a through-silicon via (TSV) formed from a back surface side of the thinned second semiconductor element; and
separates the wafer support system material from the light receiving surface after formation of the external electrode.

(13) An electronic device including:
a solid-state image sensor including
a first semiconductor element including a pixel including a photoelectric conversion element,
a second semiconductor element including a logic circuit or a memory circuit and stacked with and bonded to the first semiconductor element,
a through electrode electrically connecting the first semiconductor element and the second semiconductor element,
an external electrode formed as an external output, using a through-silicon via (TSV) formed from a back surface side of the thinned second semiconductor element,
a wafer support system material bonded on a lens after formation of the lens on a light receiving surface of the first semiconductor element, and separated from the light receiving surface after formation of the external electrode;
a signal processing circuit configured to process an output signal output from the solid-state image sensor; and
an optical system configured to cause incident light to enter the solid-state image sensor.

REFERENCE SIGNS LIST

1 Solid-state image sensor
51 CIS wafer
52 Logic wafer
53 Wiring
54 Electrode
55 PAD
61 Bonding surface
62 Si substrate
63 OCL
64 Adhesive
71 Through electrode
72 Wafer support system material
73 TSV
74 Insulating film
81 Solder ball
92 Cu surface
101 Ni/Au electrode
111 Al PAD
131 Optical function film
300 Electronic device
301 Solid-state image sensor
302 Optical lens
303 Shutter device
304 Drive circuit
305 Signal processing circuit

What is claimed is:

1. A solid-state image sensor comprising:
a first semiconductor element including a pixel including a photoelectric conversion element;
a second semiconductor element including a logic circuit or a memory circuit and stacked with and bonded to the first semiconductor element;
a through electrode electrically connecting the first semiconductor element and the second semiconductor element;
a through-silicon via (TSV) formed from a back surface side of the second semiconductor element to a pad formed in the first semiconductor element;
an electrode formed on the TSV; and
a wafer support system material comprising a glass substrate bonded to an on-chip lens by a layer of resin after formation of the lens on a light receiving surface of the first semiconductor element, wherein:
the resin separates the wafer support system material from the lens,
the light receiving surface of the first semiconductor element faces a direction opposite to a direction faced by the back surface side of the second semiconductor element,
the wafer support system material and the resin are configured to be removed from the light receiving surface after formation of the electrode, and
the back surface side of the second semiconductor element is wider than the light receiving surface of the first semiconductor element.

2. The solid-state image sensor according to claim 1, wherein the electrode is formed on a planarized Cu surface.

3. The solid-state image sensor according to claim 1, wherein the electrode is an Ni/Au electrode.

4. The solid-state image sensor according to claim 1, wherein the TSV formed from the back surface side of the second semiconductor element goes through a low-K and the pad formed in the first semiconductor element is an Al pad.

5. The solid-state image sensor according to claim 1, wherein the TSV is formed after the first and second semiconductor elements are bonded together.

6. The solid-state image sensor according to claim 1, wherein the TSV is formed before the first and second semiconductor elements are bonded together.

7. The solid-state image sensor according to claim 6, wherein an optical function film is formed on the lens.

8. The solid-state image sensor according to claim 7, wherein the optical function film is an IR cut filter and AR coating or a wafer level lens.

9. The solid-state image sensor according to claim 1, wherein a thickness of the wafer support system material is equal to or larger than 300 µm.

10. A manufacturing method in which a manufacturing apparatus forms a package by:
stacking and bonding a first semiconductor element including a pixel including a photoelectric conversion element and a second semiconductor element including a logic circuit or a memory circuit;
electrically connecting the first semiconductor element and the second semiconductor element via a through electrode;
bonding a wafer support system material comprising a glass substrate to an on-chip lens by a layer of resin after formation of the lens on a light receiving surface of the first semiconductor element, wherein the resin separates the wafer support system material from the lens, and wherein the light receiving surface of the first semiconductor element faces a direction opposite to a direction faced by a back surface side of the second semiconductor element; forming a through-silicon via (TSV) from the back surface side of the second semiconductor element to a pad formed in the first semiconductor element; and forming an electrode on the TSV, wherein the wafer support system material and the resin are configured to be removed from the light receiving surface after formation of the electrode, wherein the back surface side of the second semiconductor element is wider than the light receiving surface of the first semiconductor element.

11. The method of claim 10, wherein a thickness of the wafer support system material is equal to or larger than 300 µm.

12. An electronic device comprising:
a solid-state image sensor including:
a first semiconductor element including a pixel including a photoelectric conversion element,
a second semiconductor element including a logic circuit or a memory circuit and stacked with and bonded to the first semiconductor element,
a through electrode electrically connecting the first semiconductor element and the second semiconductor element,
a through-silicon via (TSV) formed from a back surface side of the second semiconductor element to a pad formed in the first semiconductor element,
an electrode formed on the TSV; and
a wafer support system material comprising a glass substrate bonded to an on-chip lens by a layer of resin after formation of the lens on a light receiving surface of the first semiconductor element, wherein:
the resin separates the wafer support system material from the lens,
the light receiving surface of the first semiconductor element faces a direction opposite to a direction faced by the back surface side of the second semiconductor element,
the wafer support system material and the resin is configured to be separated from the light receiving surface after formation of the electrode, and
the back surface side of the second semiconductor element is wider than the light receiving surface of the first semiconductor element;
a signal processing circuit configured to process an output signal output from the solid-state image sensor; and
an optical system configured to cause incident light to enter the solid-state image sensor.

13. The electronic device according to claim 12, wherein the electrode is a planarized Cu electrode.

14. The electronic device according to claim 12, wherein the electrode is an Ni/Au electrode.

15. The electronic device according to claim 12, wherein the TSV formed from the back surface side of the second semiconductor element goes through a low-K and the pad formed in the first semiconductor element is an Al pad.

16. The electronic device according to claim 13, wherein the TSV is formed after the first and second semiconductor elements are bonded together.

17. The electronic device according to claim 12, wherein the TSV is formed before the first and second semiconductor elements are bonded together.

18. The electronic device according to claim 17, wherein an optical function film is formed on the lens.

19. The electronic device according to claim 18, wherein the optical function film is an IR cut filter and AR coating or a wafer level lens.

20. The electronic device according to claim 12, wherein a thickness of the wafer support system material is equal to or larger than 300 µm.

* * * * *